(12) United States Patent
Lin et al.

(10) Patent No.: US 11,678,492 B2
(45) Date of Patent: Jun. 13, 2023

(54) MEMORY DEVICE, SEMICONDUCTOR DEVICE AND MANUFACTURING METHOD OF THE MEMORY DEVICE

(71) Applicant: Taiwan Semiconductor Manufacturing Company, Ltd., Hsinchu (TW)

(72) Inventors: Meng-Han Lin, Hsinchu (TW); Feng-Cheng Yang, Hsinchu County (TW); Sheng-Chen Wang, Hsinchu (TW); Han-Jong Chia, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 178 days.

(21) Appl. No.: 17/159,180

(22) Filed: Jan. 27, 2021

(65) Prior Publication Data
US 2021/0398989 A1 Dec. 23, 2021

Related U.S. Application Data

(60) Provisional application No. 63/040,540, filed on Jun. 18, 2020.

(51) Int. Cl.
*H01L 27/115* (2017.01)
*H01L 27/1159* (2017.01)
(Continued)

(52) U.S. Cl.
CPC .... *H01L 27/1159* (2013.01); *H01L 27/11592* (2013.01); *H01L 27/11597* (2013.01); *H01L 29/0673* (2013.01); *H01L 29/24* (2013.01); *H01L 29/42392* (2013.01); *H01L 29/7869* (2013.01); *H01L 29/78696* (2013.01)

(58) Field of Classification Search
CPC .......... H01L 27/1159; H01L 27/11592; H01L 27/11597; H01L 27/11587; H01L 27/11578; H01L 29/0673; H01L 29/24; H01L 29/42392; H01L 29/7869;
(Continued)

(56) References Cited

U.S. PATENT DOCUMENTS 9,875,784 B1\* 1/2018 Li ..................... H01L 29/516
11,049,880 B2\* 6/2021 Rajashekhar ..... H01L 27/11524
(Continued)

*Primary Examiner* — Nilufa Rahim
(74) *Attorney, Agent, or Firm* — JCIPRNET

(57) ABSTRACT

A memory device, a semiconductor device and a manufacturing method of the memory device are provided. The memory device includes first, second and third stacking structures, first and second channel structures, a gate dielectric layer, a switching layer, and first and second gate structures. The first, second and third stacking structures are laterally spaced apart from one another, and respectively comprise a conductive layer, an isolation layer and a channel layer. The third stacking structure is located between the first and second stacking structures. The first channel structure extends between the channel layers in the first and third stacking structures. The second channel structure extends between the channel layers in the second and third stacking structures. The gate dielectric layer and the first gate structure wrap around the first channel structure. The switching layer and the second gate structure wrap around the second channel structure.

17 Claims, 23 Drawing Sheets

(51) Int. Cl.
*H01L 27/11597* (2017.01)
*H01L 27/11592* (2017.01)
*H01L 29/786* (2006.01)
*H01L 29/06* (2006.01)
*H01L 29/423* (2006.01)
*H01L 29/24* (2006.01)

(58) Field of Classification Search
CPC ......... H01L 29/78696; H01L 29/66439; H01L 29/66833; H01L 29/775; B82Y 10/00
See application file for complete search history.

(56) References Cited

U.S. PATENT DOCUMENTS

| | | | |
|---|---|---|---|
| 2012/0139030 A1* | 6/2012 | Sakuma | H01L 29/66825 257/326 |
| 2014/0273372 A1* | 9/2014 | Sakuma | H01L 29/40117 438/268 |
| 2014/0353738 A1* | 12/2014 | Makala | H01L 27/11578 438/264 |
| 2015/0145012 A1* | 5/2015 | Chen | H01L 29/66833 257/314 |
| 2021/0036020 A1* | 2/2021 | Park | H01L 28/40 |
| 2021/0272970 A1* | 9/2021 | Lee | H01L 29/78391 |
| 2021/0305430 A1* | 9/2021 | Guler | H01L 27/088 |

\* cited by examiner

MEMORY DEVICE, SEMICONDUCTOR DEVICE AND MANUFACTURING METHOD OF THE MEMORY DEVICE

CROSS-REFERENCE TO RELATED APPLICATION

This application claims the priority benefit of U.S. provisional application Ser. No. 63/040,540, filed on Jun. 18, 2020. The entirety of the above-mentioned patent application is hereby incorporated by reference herein and made a part of this specification.

BACKGROUND

Non-volatile memory is featured in keeping stored data even when power supply is cut off, and is comprehensively used in various electronic devices. Embedded non-volatile memory refers to a type of non-volatile memory integrated with logic circuits in the same chip, and is different from discrete non-volatile memory technology (e.g., NAND flash and NOR flash) due to its specific requirements including complementary metal-oxide-semiconductor (CMOS) process compatibility, performance, cost and reliability. For instance, embedded non-volatile memory can be integrated in a microcontroller (MCU) chip, a system-on-chip (SoC) device or the like.

Although feature size of the embedded non-volatile memory has been continuously decreased over the years, structure the embedded non-volatile memory is still limited by the confines of two-dimensional design. This ultimately limits the capacity that the embedded non-volatile memory could offer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
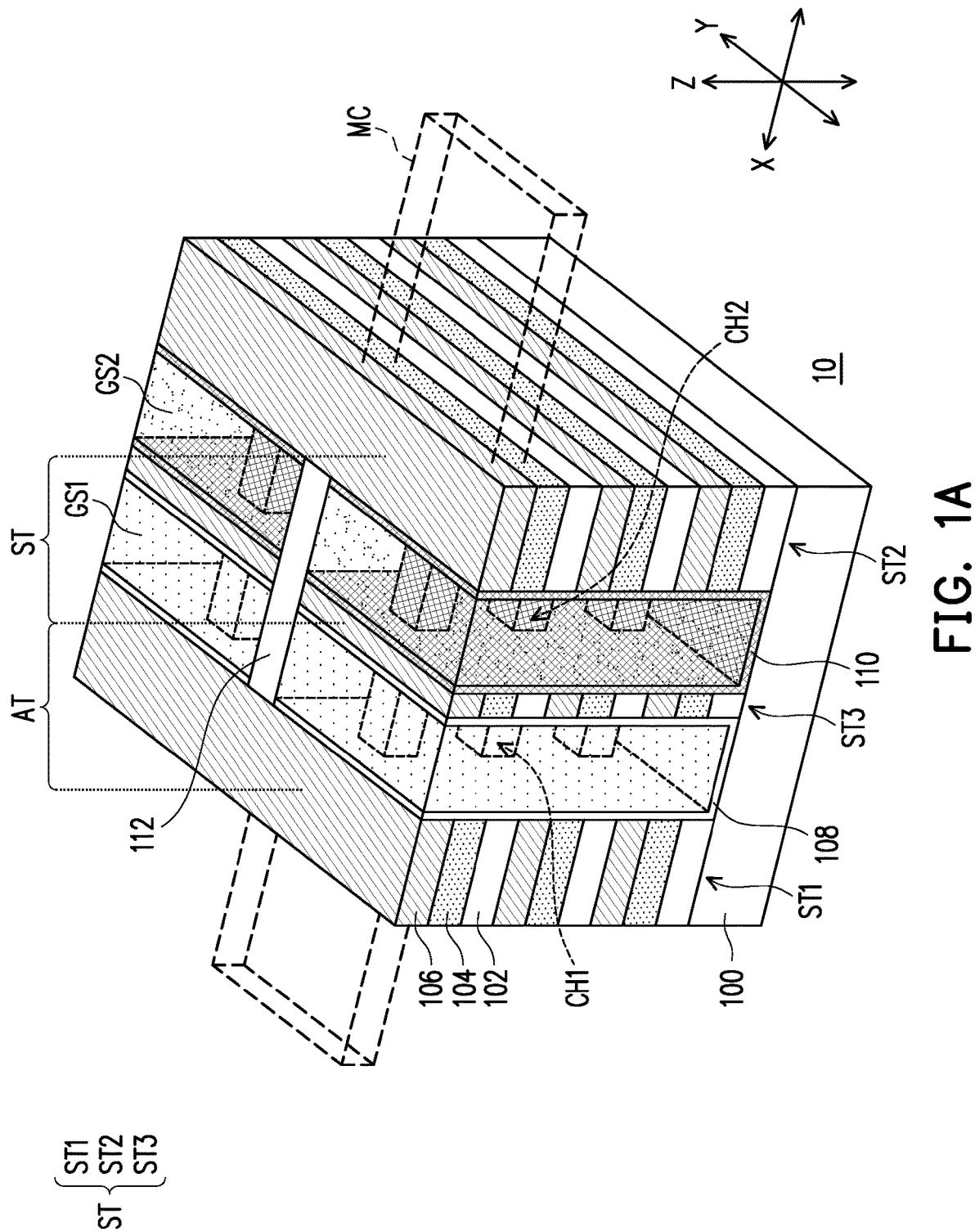
FIG. 1A is a schematic three-dimensional view illustrating a memory device according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
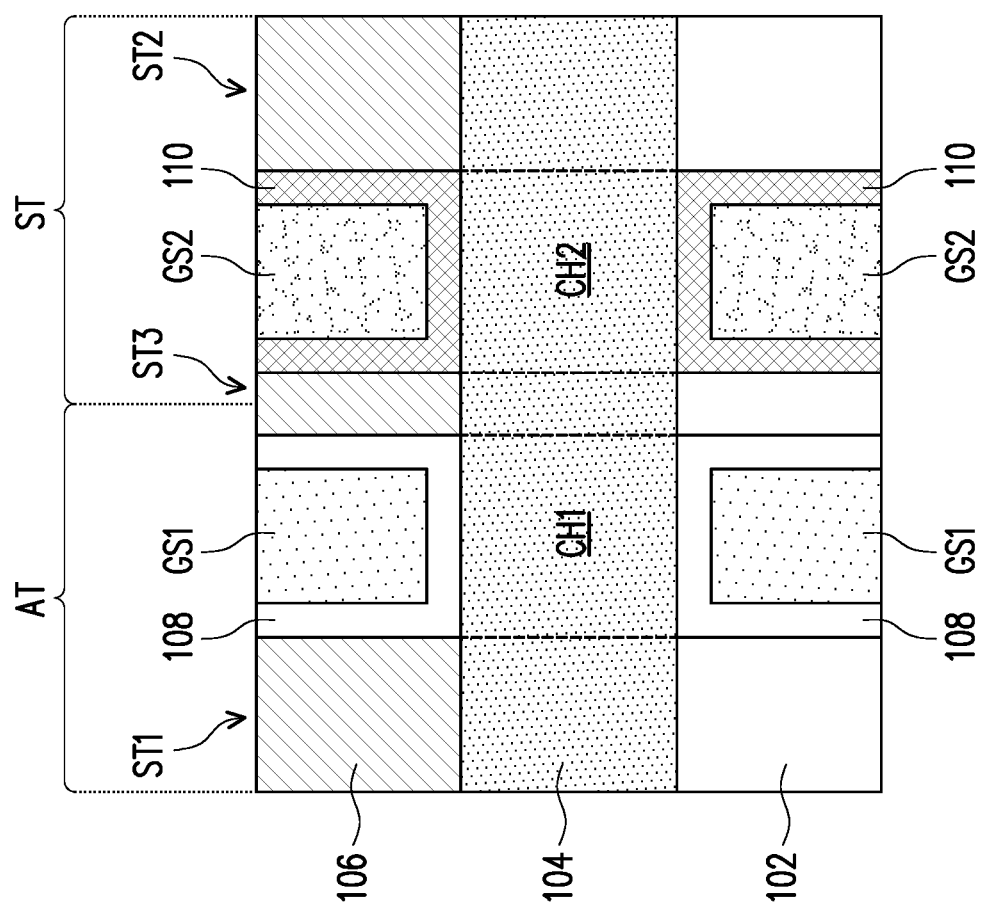
FIG. 1B is a schematic cross-sectional view cut along laterally adjacent and connected channel structures shown in FIG. 1A.
Figure 1C:
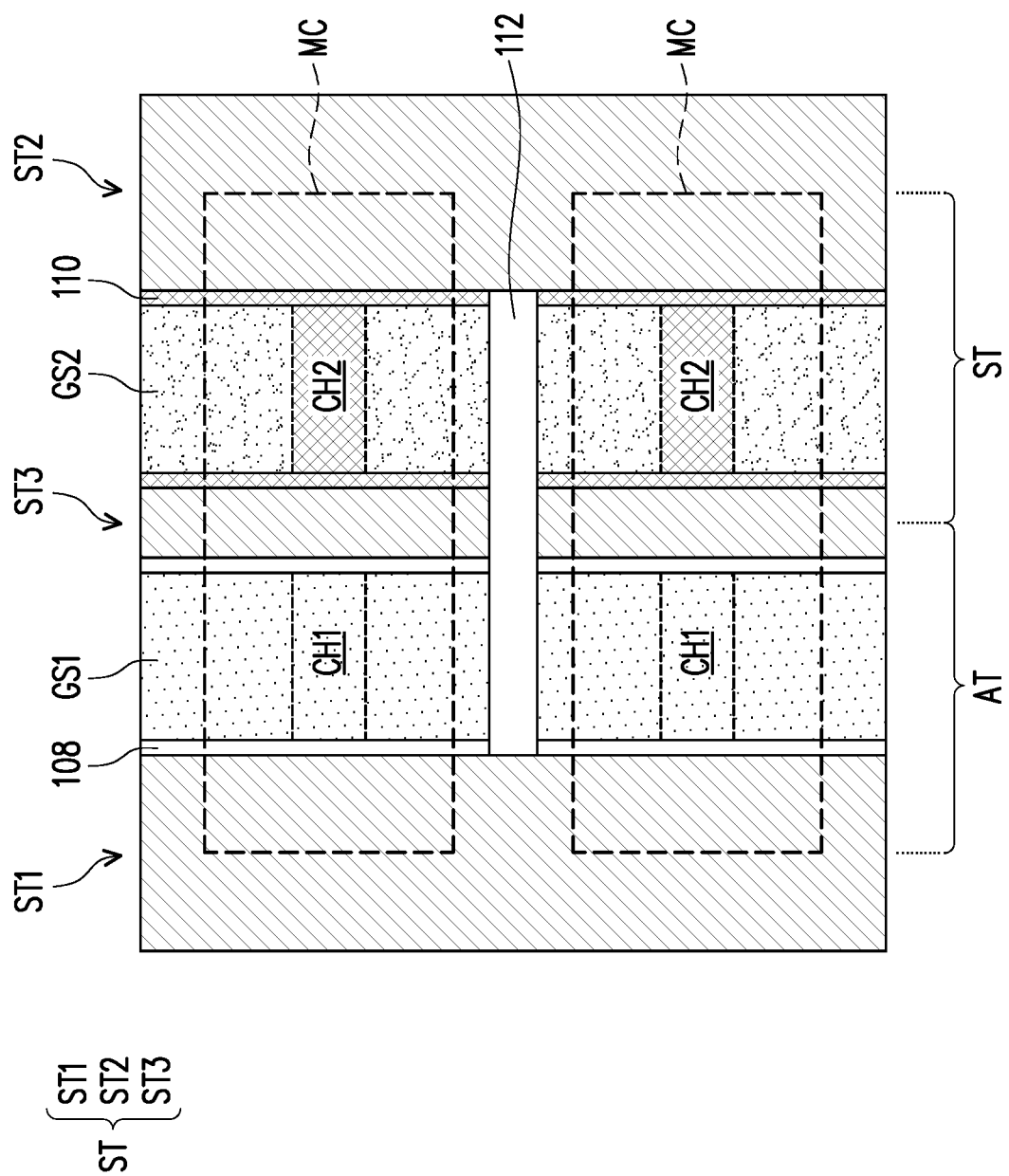
FIG. 1C is a schematic plan view illustrating laterally adjacent memory cells in the memory device as shown in FIG. 1A.
Figure 1D:
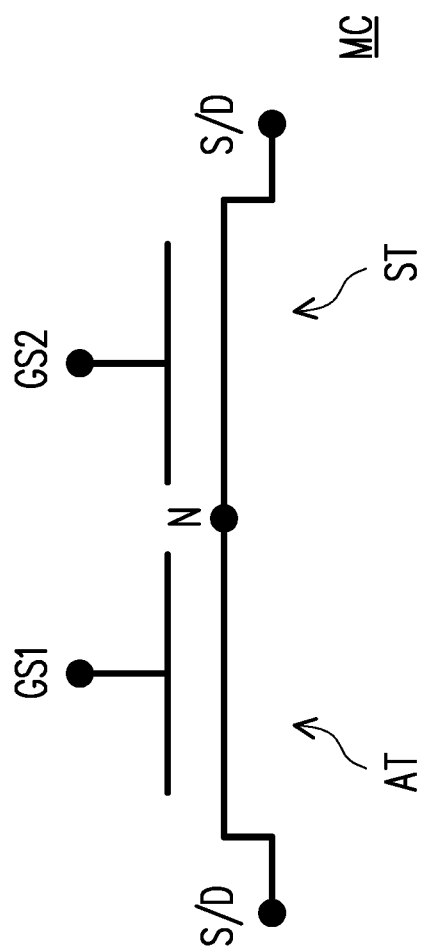
FIG. 1D is a circuit diagram of one of the memory cells in the memory device shown in FIG. 1A.

FIG. 1A is a schematic three-dimensional view illustrating a memory device 10 according to some embodiments of the present disclosure. FIG. 1B is a schematic cross-sectional view cut along a channel structure CH1 and a channel structure CH2 shown in FIG. 1A. FIG. 1C is a schematic plan view illustrating laterally adjacent memory cells MC in the memory device 10 as shown in FIG. 1A. FIG. 1D is a circuit diagram of one of the memory cells MC in the memory device 10 shown in FIG. 1A.

Referring to FIG. 1A, the memory device 10 is a three-dimensional memory device, and includes stacks of memory cells MC. As will be further described, each memory cell MC includes an access transistor AT and a storage transistor ST connected with each other via a common node. The stacks of memory cells MC are formed in laterally separated stacking structures ST as well as components located between the stacking structures ST. The stacking structures ST and the components located in between are formed on a substrate 100. In some embodiments, the substrate 100 is an etching stop layer over a semiconductor substrate (not shown), such as a semiconductor wafer or a semiconductoron-insulator (SOI) wafer. In these embodiments, active devices (e.g., transistors) and interconnections of these active devices (both not shown) may be formed between the substrate 100 and the semiconductor wafer (or the SOI wafer). In alternative embodiments, the substrate 100 is the semiconductor wafer or the SOI wafer. In addition, in some embodiments, the stacking structures ST may include a stacking structure ST1, a stacking structure ST2 and a stacking structure ST3. The stacking structures ST1, ST2, ST3 extend along a direction Y, and are separated from one another along a direction X. The stacking structure ST3 extends between the stacking structures ST1, ST2, and may have a length (i.e., the dimension in the direction X) shorter than a length of the stacking structure ST1 or the stacking structure ST2. However, those skilled in the art may adjust dimensions of the stacking structures ST according to design requirements, the present disclosure is not limited thereto.

Each stacking structure ST includes multiple film sets stacked on the substrate 100 along a vertical direction Z. In some embodiments, each film set includes an isolation layer 102, a channel layer 104 and a conductive layer 106 sequentially stacked along the vertical direction Z. In this way, the isolation layer 102 of an upper film set may be in contact with the conductive layer 106 of a lower film set. The isolation layer 102 may be formed of an insulating material, the channel layer 104 may be formed of a semiconductor material, and the conductive layer 106 may be made of a conductive material. For instance, the insulating material may include silicon oxide, silicon nitride, silicon oxynitride, the like or combinations thereof. The semiconductor material may be a metal oxide material, such as an indium-based oxide material (e.g., indium gallium zinc oxide (IGZO)). The conductive material may be a metallic material, such as Al, Ti, TiN, TaN, Co, Ag, Au, Cu, Ni, Cr, Hf, Ru, W, WN, Pt or the like. In some embodiments, the substrate 100 has sufficient etching selectivity with respect to the isolation layer 102, the channel layer 104 and the conductive layer 106, such that the substrate 100 may substantially remain intact during patterning of the stacking structure 300. For instance, the substrate 100 may be formed of silicon carbide. Furthermore, although not shown, end portions of some of the stacking structures ST (e.g., the stacking structures ST1, ST2) may be shaped into staircase structures, of which an end portion of each film set may be protruded with respect to an overlying film set. In addition, although each stacking structure ST is depicted as having three film sets, those skilled in the art may adjust the amount of the film sets in each stacking structure ST according to design and process requirements, the present disclosure in not limited thereto as well.

Stacks of channel structures CH1 are disposed between the stacking structures ST1, ST3, and are laterally separated apart from one another along the direction Y. In addition, the channel structures CH1 in each stack are vertically spaced apart from one another. Each channel structure CH1 laterally extends from one of the channel layers 104 in the stacking structure ST1 to a corresponding one of the channel layers 104 in the stacking structure ST3 along the direction X, and connects these channel layers 104. Similarly, stacks of channel structures CH2 are disposed between the stacking structures ST2, ST3, and are similar to or identical with the channel structures CH1 in terms of arrangement, structure, and dimension. In this way, the channel structures CH2 respectively connect one of the channel layers 104 in the stacking structure ST3 to a corresponding one of the channel layers 104 in the stacking structure ST2. In some embodiments, the channel structures CH1, CH2 are respectively formed in a rod shape. In addition, in some embodiments, the channel structures CH2 respectively extend along an extending line (virtual) of one of the channel structures CH1, and vice versa. The channel structures CH1, CH2 are formed of the semiconductor material of the channel layers 104. It should be noted that, although the channel structures CH1, CH2 and the channel layers 104 are described as individual components, the channel structures CH1, CH2 and the channel layers 104 at the same height may be actually formed from the same material layer. As will be further described, this material layer is patterned to form the channel structures CH1, CH2 and the channel layers 104 at the same height.

Referring to FIG. 1A and FIG. 1B, a gate dielectric layer 108 conformally covers surfaces of the channel structures CH1 and opposing sidewalls of the stacking structures ST1, ST3. The gate dielectric layer 108 is functioned to realize capacitive coupling between a gate structure (i.e., the gate structure GS1 as will be further described) and the channel structures CH1 of some transistors (i.e., the access transistor AT as will be further described). As shown in FIG. 1A, in some embodiments, topmost surfaces of the gate dielectric layer 108 are substantially coplanar with top surfaces of the stacking structures ST. On the other hand, in some embodiments, portions of the substrate 100 between the stacking structures ST1, ST3 are also covered by the gate dielectric layer 108. The gate dielectric layer 108 is formed of a dielectric material, and alternatives of the dielectric material may include a high-k dielectric material (e.g., a dielectric material having dielectric constant (k) greater than 3.9, or greater than 7 or more) and silicon oxide. For instance, the high-k dielectric material may include hafnium oxide, hafnium aluminum oxide, hafnium silicate, tantalum oxide, aluminum oxide, zirconium oxide, the like or combinations thereof.

Similarly, a switching layer 110 conformally covers surfaces of the channel structures CH2 and opposing sidewalls of the stacking structures ST2, ST3. The switching layer 110 may be similar to or identical with the gate dielectric layer 108 in terms of structure, but different from the gate dielectric layer 108 in terms of function and material. In other words, in some embodiments, topmost surfaces of the switching layer 110 are substantially coplanar with the top surfaces of the stacking structures ST. In addition, in some embodiments, portions of the substrate 100 between the stacking structures ST2, ST3 are also covered by the switching layer 110. On the other hand, in addition to realize capacitive coupling between a gate structure (i.e., the gate structure GS2 as will be further described) and the channel structures CH2 of some transistors (i.e., the storage transistor ST as will be further described), the switching layer 110 is further functioned to switch a threshold voltage of each transistor from a lower value to a higher value (or vice versa). In some embodiments, the switching layer 110 is formed of a ferroelectric material, and the switching of the threshold voltage is realized by changing the direction of the dipole moment stored in the switching layer 110. For instance, the ferroelectric material may include a hafnium-oxide-based material, such as hafnium zirconium oxide (HZO). In alternative embodiments, the switching of the threshold voltage is determined by whether charges are trapped in the switching layer 110. In these alternative embodiments, the switching layer 110 may be a multilayer structure, such as an oxide-nitride-oxide (ONO) multilayer structure.

The gate structure GS1 fills up the trench between the stacking structures ST1, ST3, and the gate structure GS2 fills up the trench between the stacking structures ST2, ST3. Accordingly, the channel structures CH1 are covered by the gate dielectric layer 108, and are wrapped by the gate structure GS1. Similarly, the channel structures CH2 are covered by the switching layer 110, and are wrapped by the gate structure GS2. The gate structures GS1, GS2 are respectively formed of a metallic material. For instance, the metallic materials for forming the gate structures GS1, GS2 may respectively include tungsten, Al, Ti, TiN, TaN, Co, Ag, Au, Cu, Ni, Cr, Hf, Ru, WN, Pt or the like. In some embodiments, the gate structures GS1, GS2 are formed of the same metallic material. In alternative embodiments, the gate structures GS1, GS2 are formed of different metallic materials.

Referring to FIG. 1A, in some embodiments, an isolation wall 112 standing on the substrate 100 cuts each of the gate structure GS1, the gate dielectric layer 108, the stacking structure ST3, the gate structure GS2 and the switching layer 110 into separated portions. As shown in FIG. 1A, the isolation wall 112 may be intersected with the stacking structure ST3, and extend between adjacent stacks of the channel structures CH1 as well as adjacent stacks of the channel structures CH2. In this way, adjacent stacks of the channel structures CH1 are wrapped by different portions of the gate structure GS1, and adjacent stacks of the channel structures CH2 are wrapped by different portions of the gate structure GS2. Moreover, in some embodiments, the isolation wall 112 may be in lateral contact with the stacking structures ST1, ST2. In these embodiments, the gate dielectric layer 108 may be cut into separated portions by the isolation wall 112, and the switching layer 110 may be cut into separated portions by the isolation wall 112 as well. The isolation wall 112 is formed of an insulating material, such as silicon oxide, silicon nitride, silicon oxynitride or the like.

One of the channel structures CH1, a portion of the gate dielectric layer 108 covering this channel structure CH1, the gate structure GS1 wrapping up this channel structure CH1, the channel layers 104 connected with this channel structure CH1 and the conductive layers 106 lying on these channel layers 104 collectively form a field effect transistor, and is referred as the access transistor AT. The gate structure GS1 is functioned as a gate terminal of the access transistor AT, and the conductive layers 106 are functioned as source and drain terminals of the access transistor AT. A conductive path may be formed in the channel structure CH1 when the access transistor AT is turned on, and such conductive path may be cut off or absent when the access transistor AT is in an off state. As shown in FIG. 1A, multiple stacks of the access transistors AT are formed by the stacking structures ST1, ST3, the gate dielectric layer 108, the channel structures CH1 and the gate structure GS1, and these stacks of the access transistors AT are operationally separated from each other because of the isolation wall 112. In some embodiments, the isolation wall 112 cuts each of the gate structure GS1, the gate dielectric layer 108 and the stacking structure ST3 into separated portions. In these embodiments, gate terminals of different stacks of the access transistors AT are separated, and can be independently controlled. In addition, drain terminals (or source terminals) of different stacks of the access transistors AT are located in separated portions of the stacking structure ST3, and are electrically isolated from each other. On the other hand, the access transistors AT in the same stack share the same gate terminal, and can be controlled by different pairs of source and drain terminals (i.e., different pairs of conductive layers 106). Further, vertically adjacent pairs of source and drain terminals in the same stack of the access transistors AT are isolated from each other by one of the isolation layers 102. In this way, the access transistors AT in the same stack can be independently controlled as well.

Similarly, one of the channel structures CH2, a portion of the switching layer 110 covering this channel structure CH2, the gate structure GS2 wrapping up this channel structure CH2, the channel layer 104 connected with this channel structure CH2 and the conductive layers 106 on these channel layers 106 collectively form a field effect transistor, which is referred as the storage transistor ST. The gate structure GS2 is functioned as a gate terminal of the storage transistor ST, and the conductive layers 106 are functioned as source and drain terminals of the storage transistor ST. In those embodiments where the switching layer 110 is a ferroelectric layer, a voltage bias is set across the portion of the switching layer 110 covering the channel structure CH2 during a programming operation, and a dipole moment is stored in the switching layer 110 due to ferroelectric polarization. On the other hand, a reverse voltage bias is set across the portion of the switching layer 110 during an erase operation, and a dipole moment reversal can be observed in the switching layer 110. By storing the dipole moments with opposite directions, the storage transistor ST may have a relatively high threshold voltage and a relatively low threshold voltage, thus a high logic state and a low logic state can be stored in the storage transistor ST. In those alternative embodiments where the switching layer 110 includes a charge trapping layer, charges may be inserted into the switching layer 110 by a tunneling effect during a programming operation, and the charges may be depleted from the switching layer 110 during an erase operation. Accordingly, the threshold voltage of the storage transistor ST may be altered due to the insertion/removal of these charges, and a high logic state and a low logic state can be stored in the storage transistor ST as well. As shown in FIG. 1A, multiple stacks of the storage transistors ST are formed by the stacking structures ST2, ST3, the switching layer 110, the channel structures CH2 and the gate structure GS2. As similar to stacks of the access transistors AT, the stacks of the storage transistors ST are operationally separated from each other because of the isolation wall 112. In addition, the storage transistors ST in the same stack can be independently controlled as well. Further, the conductive layers 106 in the stacking structure ST3 are respectively functioned as a common source or drain terminal of the laterally adjacent access transistor AT and storage transistor ST.

Referring to FIG. 1A, FIG. 1C and FIG. 1D, one of the access transistors AT and one of the storage transistors ST connected to this access transistor AT collectively form a memory cell MC. As shown in FIG. 1A, stacks of the memory cells MC are formed in the memory device 10. As shown in FIG. 1A and FIG. 1C, laterally adjacent memory cells MC share the same pair of conductive layers 106 in the stacking structures ST1, ST2, and other portions of these laterally adjacent memory cells MC are separated from each other by the isolation wall 112. As shown in FIG. 1D, the access transistor AT and the storage transistor ST in the same memory cell MC are connected with each other via a common source/drain terminal N, which is one of the conductive layers 106 in the stacking structure ST3 as shown in FIG. 1C. Other source/drain terminals of the memory cell MC including a source/drain terminal S/D of the access transistor AT and a source/drain terminal S/D of the storage transistor ST are the conductive layers 106 in the stacking structures ST1, ST2 as shown in FIG. 1C. The common source/drain terminal N may be electrically floated if the access transistor AT is in an off state, and the storage transistor ST may not be turned on. Thus, the storage transistor ST may not be subjected to a programming operation, an erase operation nor a reading operation. On the other hand, if the access transistor AT is turned on, the storage transistor ST is accessible by controlling the voltages supplied to the gate structure GS2 and the source/drain terminals S/D. Accordingly, the storage transistor ST is allowed to be programmed/erased or subjected to a read operation. In some embodiments, the common source/drain terminals N (i.e., the conductive layers 106 in the stacking structure ST3) are not subjected to further routing, and the stacking structure ST3 may have a shorter length (i.e., a dimension along the direction X) as compared to the stacking structures ST1, ST2. In a programming operation, the access transistor AT and the storage transistor ST of a selected memory cell MC are turned on, and the storage transistor ST of the selected memory cell MC may be written by ferroelectric polarization or tunneling effect. In a read operation, the access transistor AT of a selected memory cell MC is turned on, and a read voltage is applied to the gate structure GS2 of the storage transistor ST. A threshold voltage of the storage transistor ST, which could be altered during a programming operation, can determine whether the read voltage is sufficient to turn on the storage transistor ST. If the read voltage is greater than the threshold voltage, the storage transistor ST could be turned on, and current can flow across the source/drain terminals S/D. On the other hand, if the read voltage is less than the threshold voltage, the storage transistor ST may be in an off state, and there would not be current flowing across the source/drain terminals S/D. Therefore, by sensing the current across the source/drain terminals S/D, a storage state of the storage transistor ST can be read out. Moreover, in an erase operation, the access transistor AT of a selected memory cell MC is turned on, and an erase voltage is set across the gate structure GS2 of the storage transistor ST in the selected memory cell MC, and the stored data can be erased by a ferroelectric polarization or tunneling effect.

As described above, the memory device 10 includes stacks of the memory cells MC. Since the memory cells MC are stackable, the memory device 10 is no longer limited by two-dimensional design, and a storage density of the memory device 10 may be significantly increased. Further, in those embodiments where the gate structures GS1, GS2 are formed of metallic material(s), the memory device 10 can be more compatible with back-end-of-line (BEOL) process due to lower process temperature. A method for forming a polysilicon gate structure may include an activation step at a temperature higher than 1000° C. As compared to the polysilicon gate structure, the metallic gate structures GS1, GS2 according to some embodiments of the present disclosure may be formed at a process temperature below 400° C. Therefore, if the memory device 10 is integrated in a BEOL structure, thermal damages on other portions of the BEOL structure as well as an underlying front-end-of-line (FEOL) structure can be significantly reduced. Moreover, as compared to programming a storage transistor by using hot carrier injection effect, a much lower voltage is required for programming the storage transistor ST including the ferroelectric switching layer 110 according to some embodiments of the present disclosure.

Figure 2:
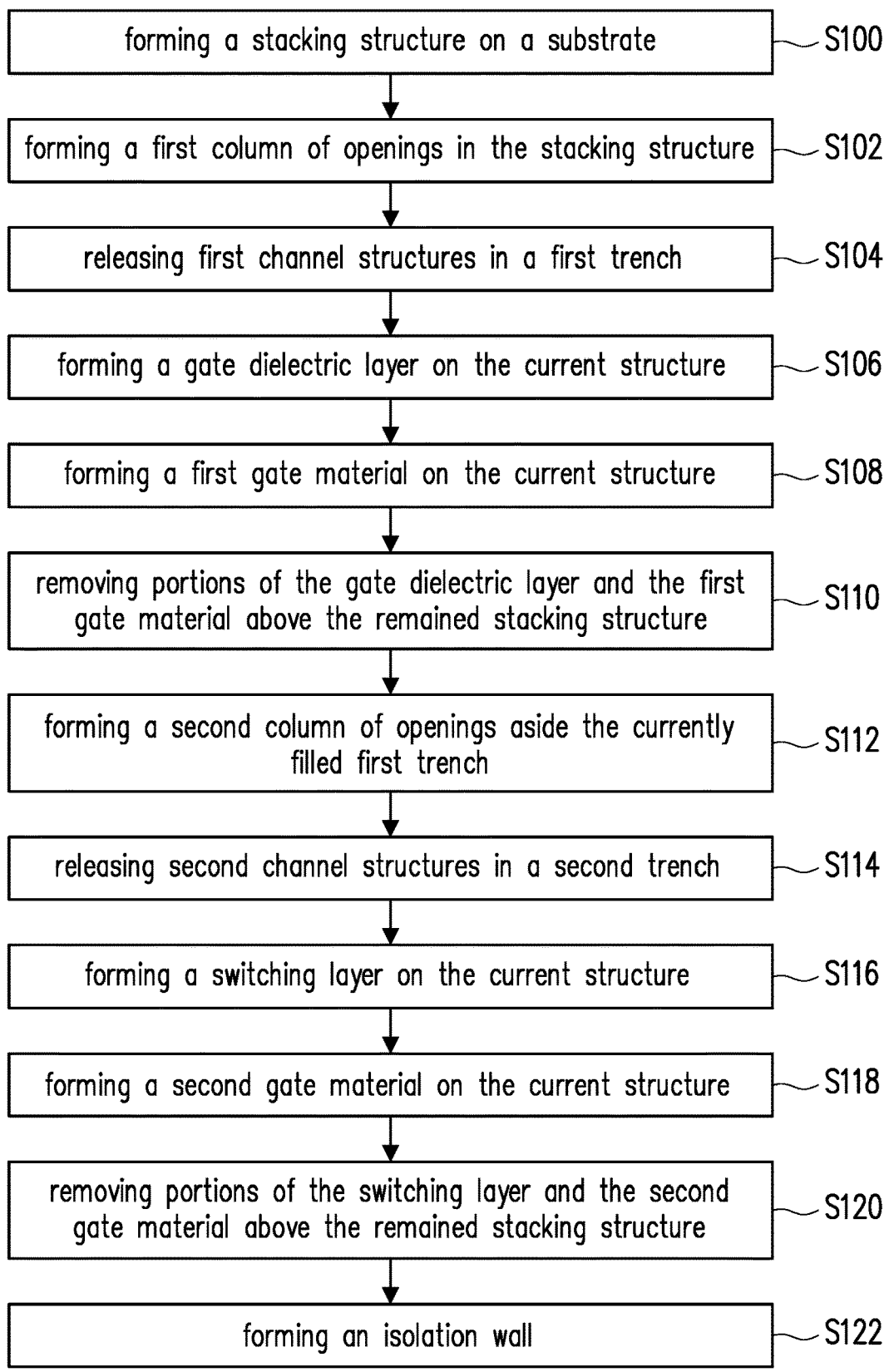
FIG. 2 is a flow diagram of a manufacturing method for forming the memory device shown in FIG. 1A.

FIG. 2 is a flow diagram of a manufacturing method for forming the memory device 10 shown in FIG. 1A. FIG. 3A through FIG. 3K are schematic three-dimensional views illustrating structures at various stages during the manufacturing process of the memory device 10 shown in FIG. 2.

Figure 3A:
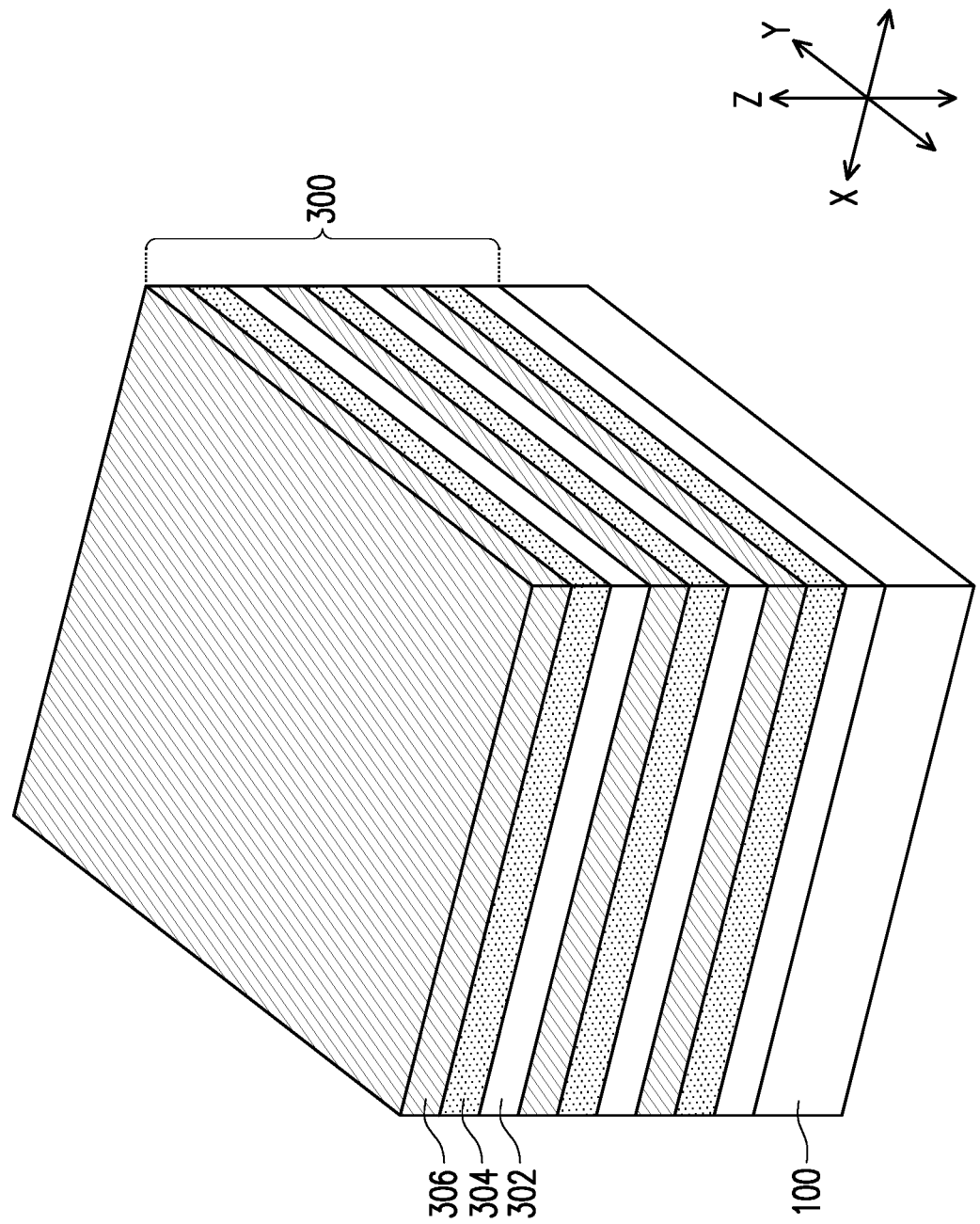
FIG. 3A through FIG. 3K are schematic three-dimensional views illustrating structures at various stages during the manufacturing process of the memory device shown in FIG. 2.

Referring to FIG. 2 and FIG. 3A, step S100 is performed, and a stacking structure 300 is formed on the substrate 100. The stacking structure 300 includes multiple film sets stacked along the vertical direction Z. Each film set includes an isolation layer 302, a channel layer 304 and a conductive layer 306. The channel layers 304 are respectively sandwiched between one of the isolation layers 302 and one of the conductive layers 306. In some embodiments, the isolation layers 302 are respectively the bottommost layer in one of the film sets, and the conductive layers 306 are respectively the topmost layer in one of the film sets. The isolation layers 302 will be patterned to form the isolation layers 102 as shown in FIG. 1A. The channel layers 304 will be patterned to form the channel layers 104 and the channel structures CH1, CH2 as shown in FIG. 1A. The conductive layers 306 will be patterned to form the conductive layers 106 as shown in FIG. 1A. In some embodiments, the isolation layers 302 and the channel layers 304 are respectively formed by a chemical vapor deposition (CVD) process. In addition, the conductive layers 306 may be respectively formed by a CVD process or a physical vapor deposition (PVD) process.

Figure 3B:
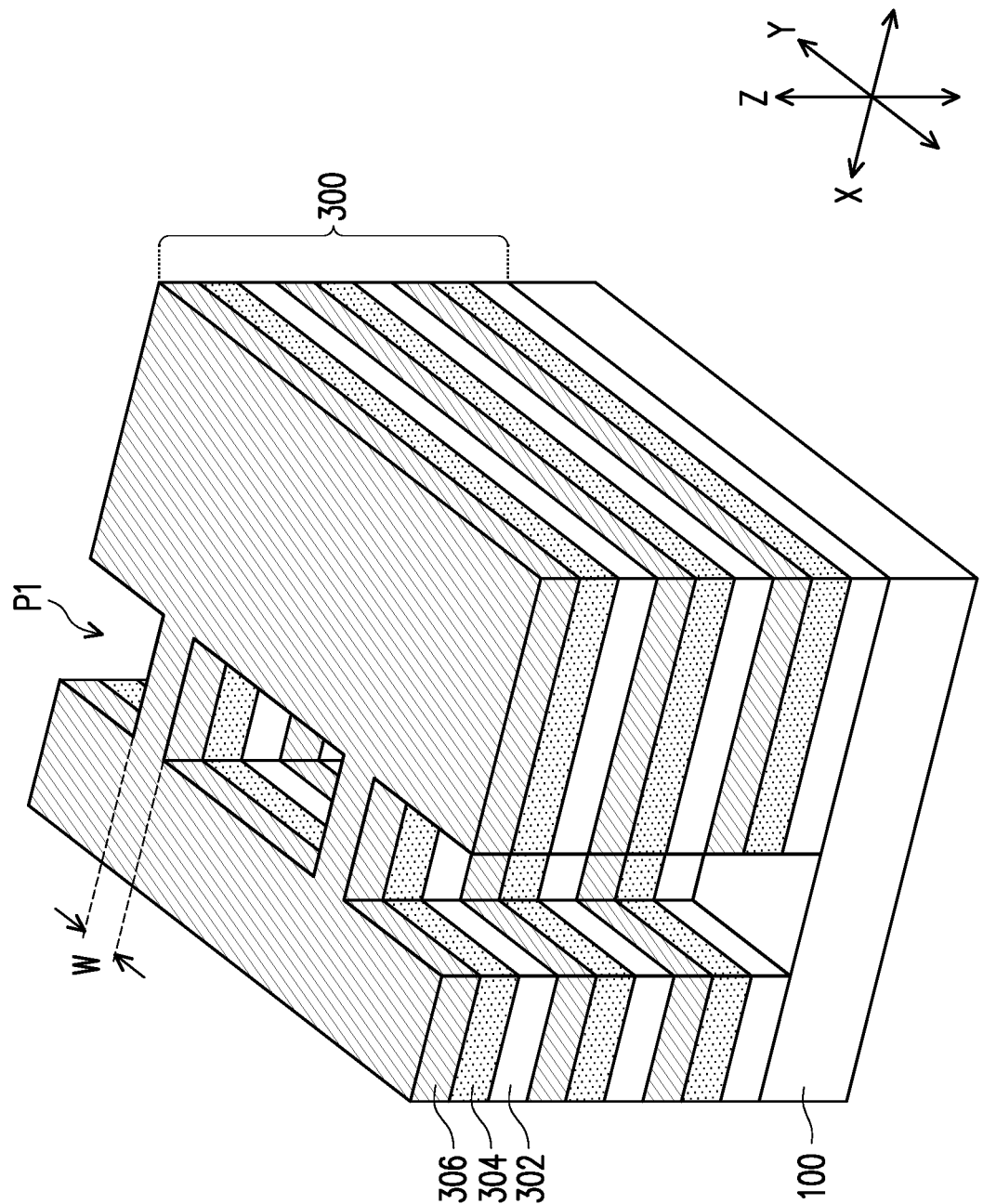

Referring to FIG. 2 and FIG. 3B, step S102 is performed, and openings P1 are formed in the stacking structure 300. The openings P1 penetrate through the stacking structure 300 along the vertical direction Z, and may expose portions of the substrate 100. In addition, the openings P1 are laterally spaced apart from one another, and are arranged along the direction Y. The openings P1 will be communicated with one another to form the trench for accommodating the channel structures CH1, the gate dielectric layer 108 and the gate structure GS1 as shown in FIG. 1A in the following step. The channel structures CH1 shown in FIG. 1A are currently embedded in portions of the remained stacking structure 300 between the openings P1, and will be released in subsequent steps. In some embodiments, the portions of the remained stacking structure 300 embedded with the channel structures CH1 are narrow enough that other portions of the remained stacking structure 300 may only be slightly consumed during the subsequent channel release step. For instance, a width W of these portions of the remained stacking structure 300 may range from 1 nm to 100 nm. A method for forming the openings P1 may include a lithography process and an etching process (e.g., an anisotropic etching process).

In some embodiments, as will be further described with reference to FIG. 5, one or more sides of the stacking structure 300 is/are shaped into staircase structure(s) before forming the openings P1. In these embodiments, the staircase structure(s) is/are formed by a staircase-first process. The conductive layers 306 may respectively be exposed at steps of the staircase structure(s). A method for shaping the stacking structure 300 to form the staircase structure(s) may include a trim-and-etch process. Furthermore, a dielectric layer (not shown) may be subsequently formed on the staircase structure(s). A top surface of this dielectric layer may be leveled with a top surface of the stacking structure 300.

Figure 3C:
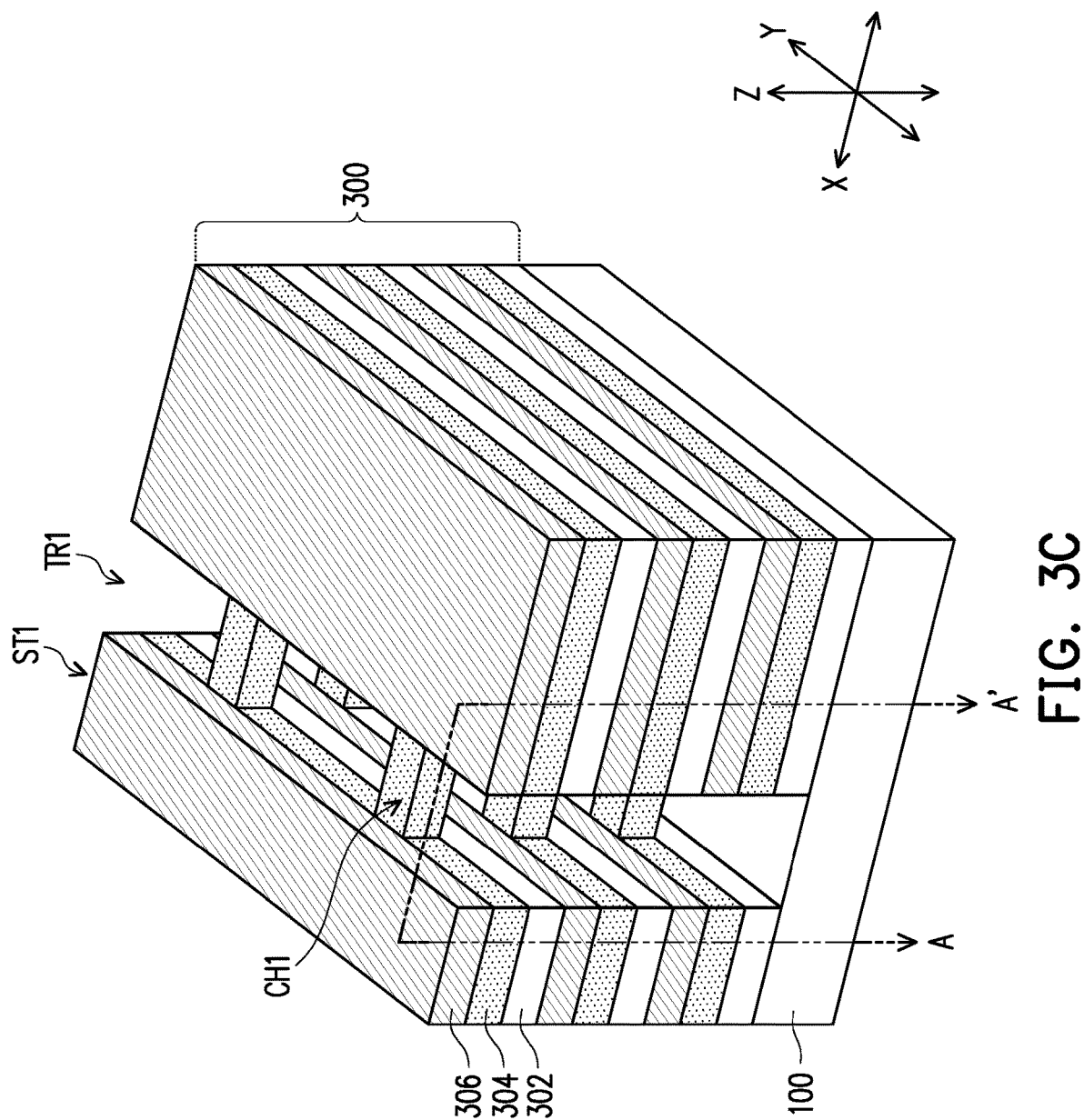

Referring to FIG. 2 and FIG. 3C, step S104 is performed, and the channel structures CH1 are released. The conductive layers 306 and the isolation layers 302 in the portions of the remained stacking structure 300 between the openings P1 are removed. As a result, the openings P1 are currently communicated with one another to form a trench TR1. In addition, the channel layers 304 in these portions of the stacking structure 300 are released, to form the channel structures CH1. The channel structures CH1 extend across the trench TR1, and bridge portions of the channel layers 304 at opposite sides of the trench TR1. One of the portions of the remained stacking structure 300 at opposite sides of the trench TR1 forms the stacking structure ST1 as described with reference to FIG. 1A. In some embodiments, a method for releasing the channel structures CH1 includes at least one isotropic etching process. Since the channel layers 304 have sufficient etching selectivity with respect to the conductive layers 306 and the isolation layers 302, the channel layers 304 may substantially remain intact during the isotropic etching process. Further, as described with reference to FIG. 3B, the width W of the portions of the stacking structure 300 between the openings P1 may be short enough that the conductive layers 306 and the isolation layers 302 in other portions of the stacking structure 300 may only be slightly consumed (not shown in FIG. 3C) during the isotropic etching process.

Figure 4:
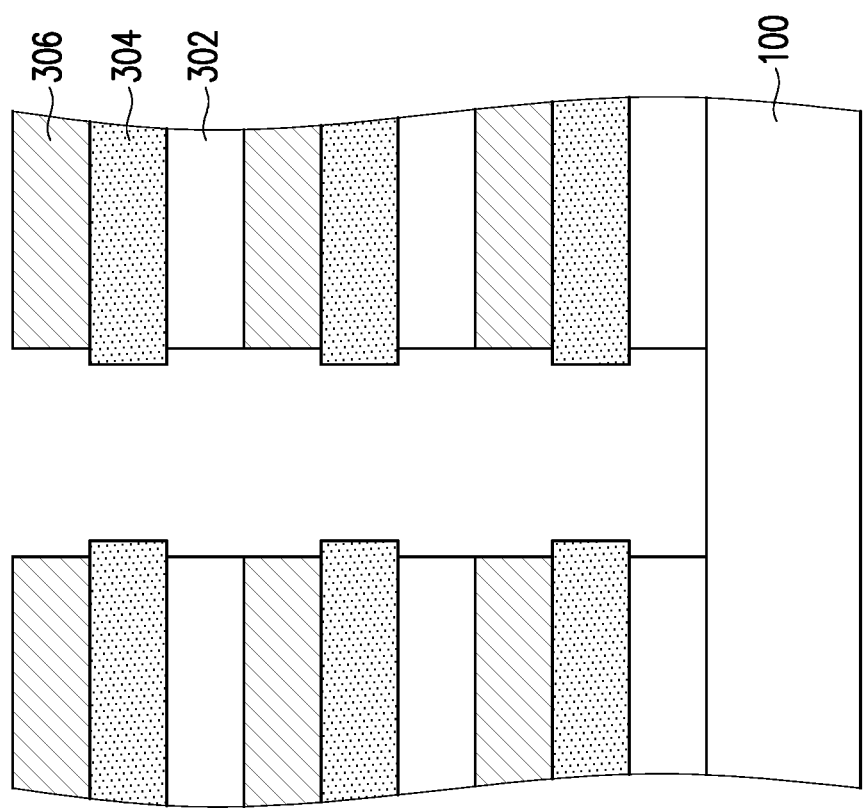
FIG. 4 is an enlarged schematic cross-sectional view along a line A-A' shown in FIG. 3C according to some embodiments of the present disclosure.

FIG. 4 is an enlarged schematic cross-sectional view along a line A-A' shown in FIG. 3C according to some embodiments of the present disclosure.

Referring to FIG. 3C and FIG. 4, in some embodiments, the conductive layers 306 and the isolation layers 302 in the portions of the remained stacking structure 300 at opposite sides of the trench TR1 are laterally recessed with respect to the channel layers 304 during the release of the channel structures CH1. Further, although the lateral recess of the conductive layers 306 is depicted as identical with the lateral recess of the isolation layers 302, the lateral recess of the conductive layers 306 may alternatively be greater or less than the lateral recess of the isolation layers 302. The lateral recesses of the conductive layers 306 and the isolation layers 302 may respectively vary according to the materials of these layers and/or other process conditions.

Figure 3D:
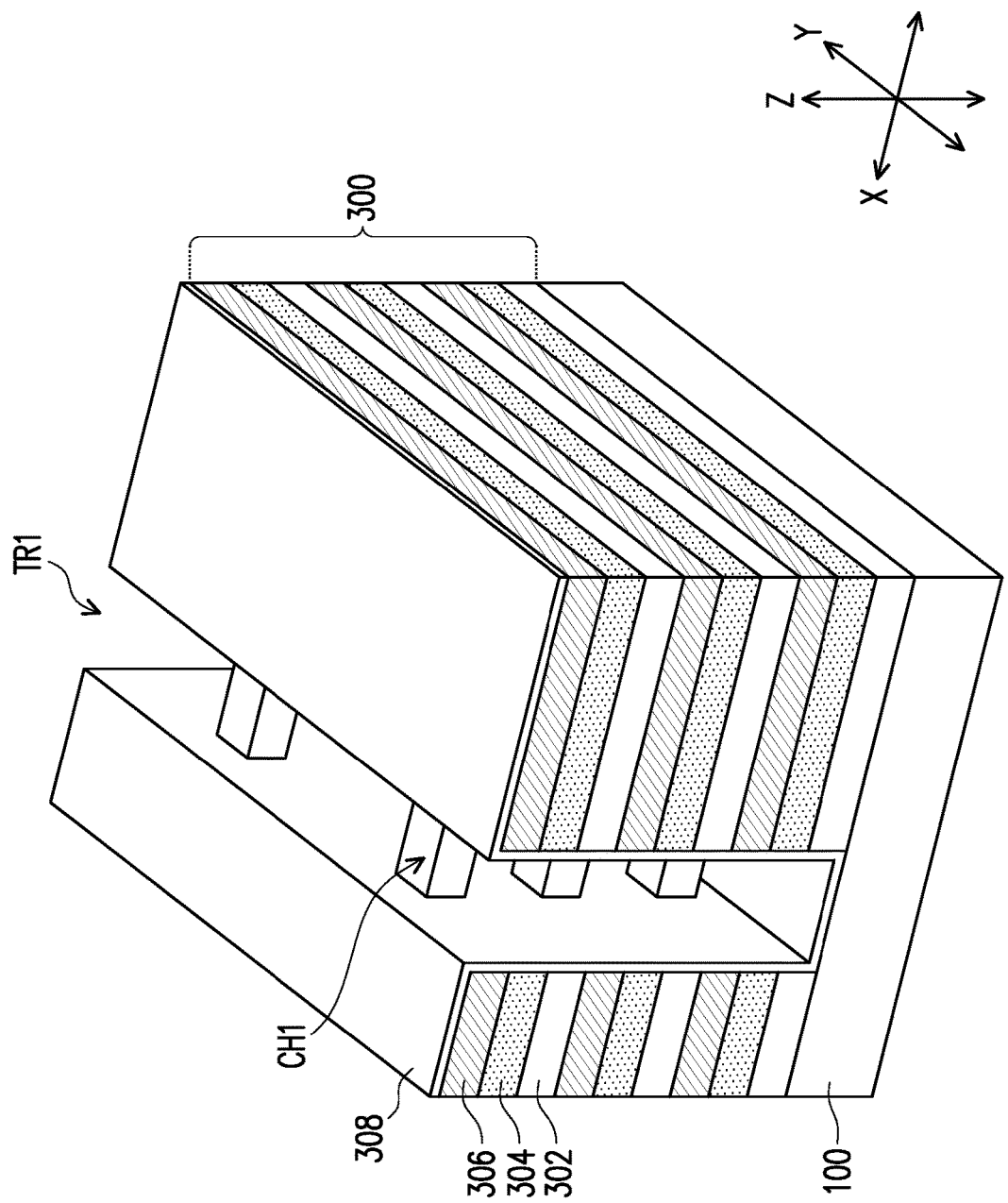

Referring to FIG. 2 and FIG. 3D, step S106 is performed, and a gate dielectric layer 308 is formed on the current structure. The gate dielectric layer 308 will be patterned to form the gate dielectric layer 108 as shown in FIG. 1A. In some embodiments, the gate dielectric layer 308 globally and conformally covers the structure shown in FIG. 3C. Accordingly, exposed surfaces of the channel structures CH1, the remained stacking structure 300 and the substrate 100 may be conformally covered by the gate dielectric layer 308. In some embodiments, a method for forming the gate dielectric layer 308 may include a deposition process, such as an atomic layer deposition (ALD) process or a CVD process.

Figure 3E:
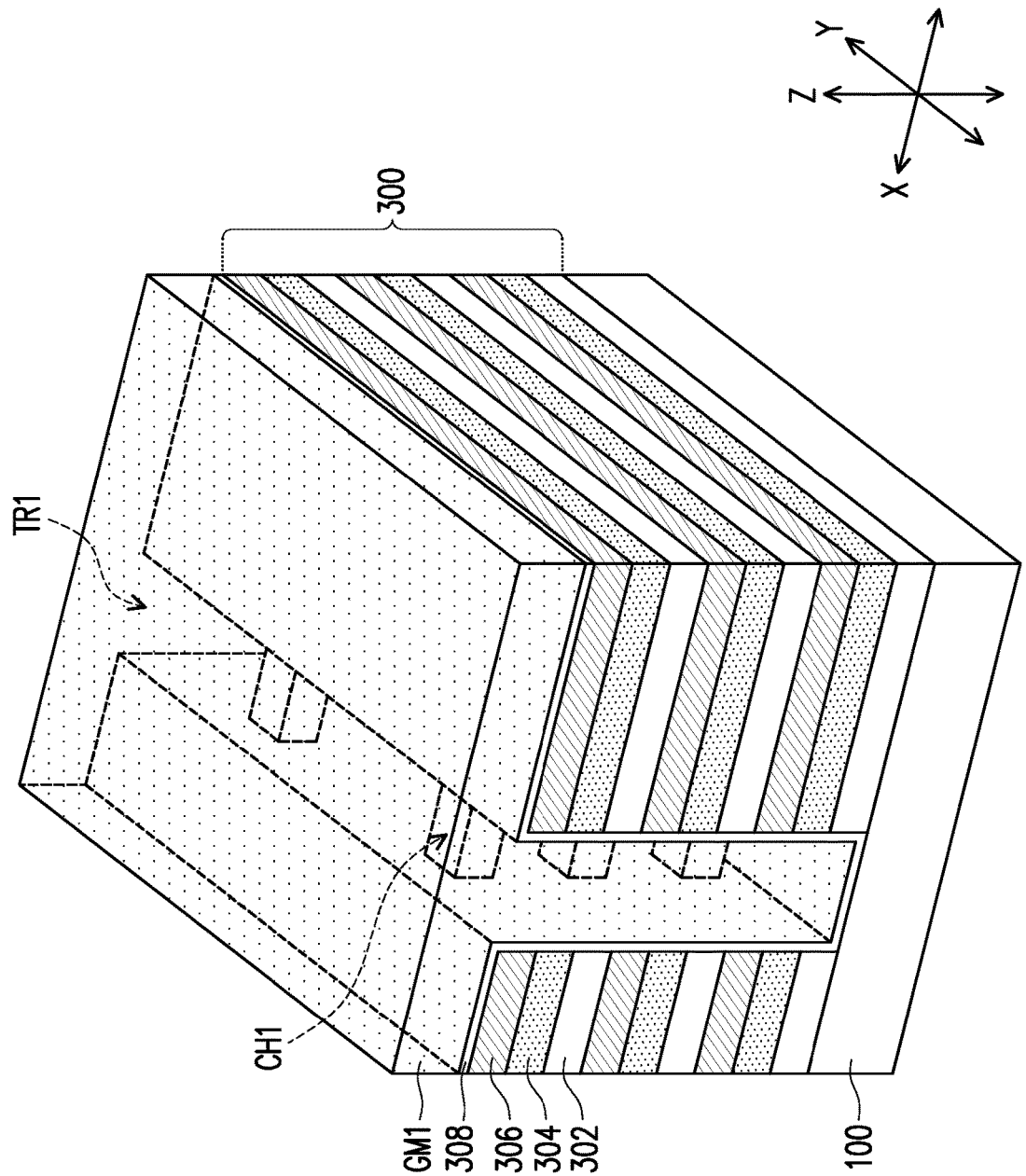

Referring to FIG. 2 and FIG. 3E, step S108 is performed, and a gate material GM1 is formed on the current structure. The gate material GM1 will be patterned to form the gate structure GS1 as shown in FIG. 1A. The gate material GM1 fills up the trench TR1, and may extend onto the remained stacking structure 300. In this way, the channel structures CH1 in the trench TR1 are wrapped by the gate dielectric layer 308 and the gate material GM1, and portions of the gate dielectric layer 308 above the remained stacking structure 300 may also be covered by the gate material GM1. In some embodiments, a method for forming the gate material GM1 includes a deposition process (e.g., a CVD process or a PVD process), a plating process or a combination thereof.

Figure 3F:
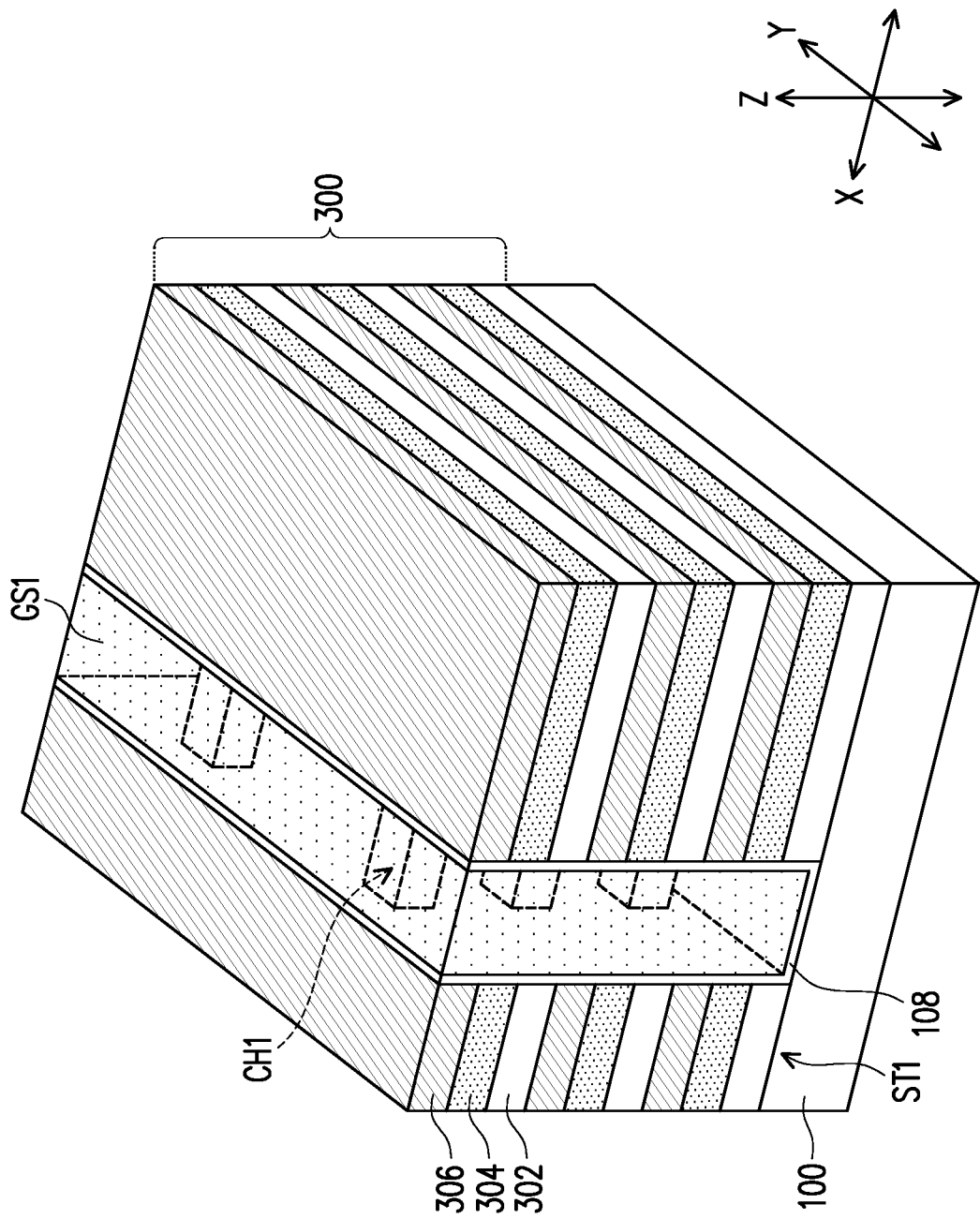

Referring to FIG. 2 and FIG. 3F, step S110 is performed, and portions of the gate material GM1 and the gate dielectric layer 308 above the remained stacking structure 300 are removed. The remained gate material GM1 forms the gate structure GS1 as shown in FIG. 1A, and the remained gate dielectric layer 308 forms the gate dielectric layer 108 as shown in FIG. 1A. In addition, a top surface of the remained stacking structure 300 is currently exposed. In some embodiments, a method for removing the portions of the gate material GM1 and the gate dielectric layer 308 above the stacking structure 300 includes a planarization process. For instance, the planarization process may include a polishing process (e.g., a chemical mechanical polishing (CMP) process), an etching process or a combination thereof.

Figure 3G:
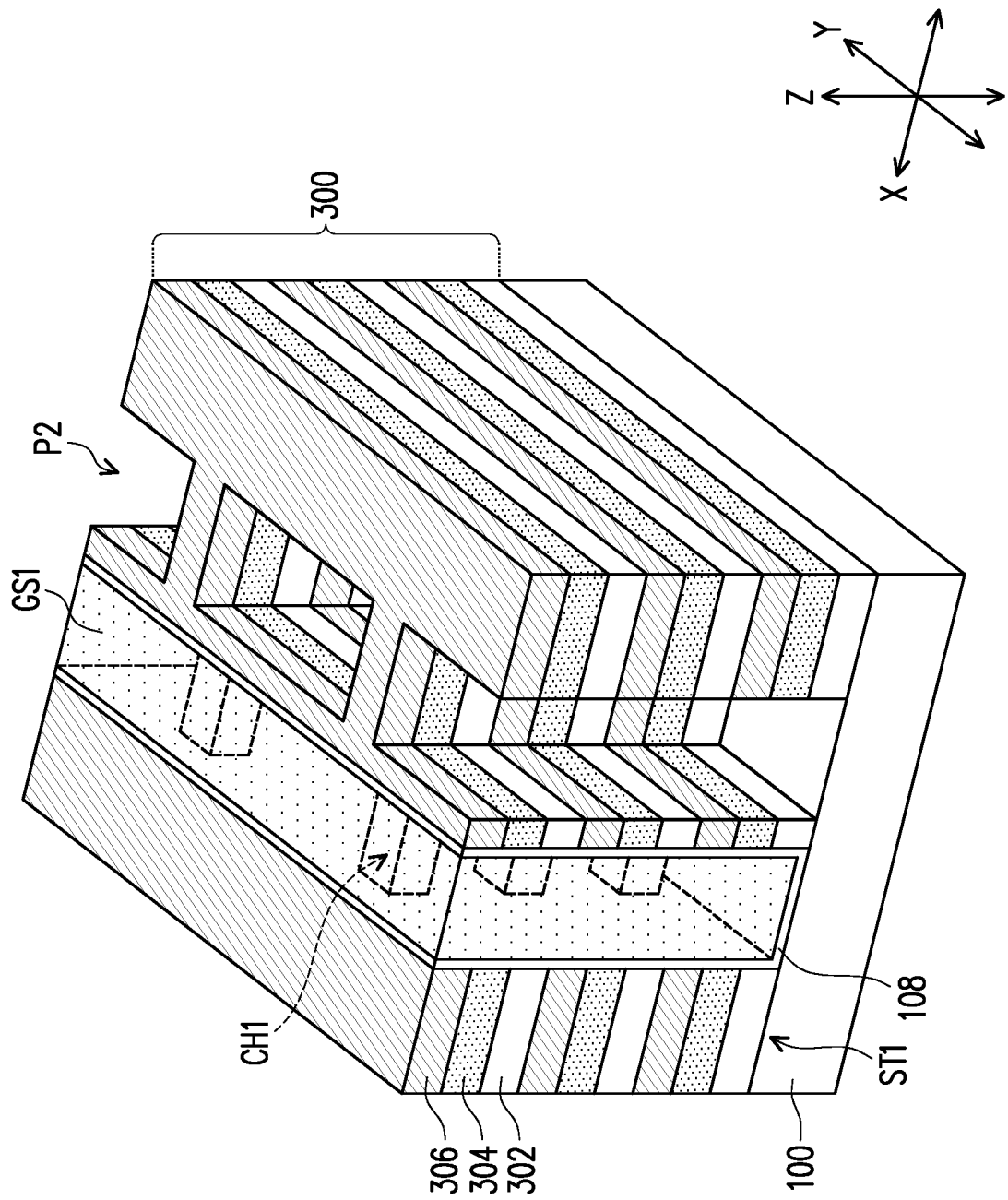

Referring to FIG. 2 and FIG. 3G, step S112 is performed, and openings P2 are formed aside the currently filled trench TR1. As similar to the openings P1 described with reference to FIG. 3B, the openings P2 penetrate through the stacking structure 300, and may expose portions of the substrate 100. In addition, the openings P2 are laterally spaced apart from one another, and are arranged along the direction Y. The openings P2 will be communicated with one another to form the trench for accommodating the channel structures CH2, the switching layer 110 and the gate structure GS2 as shown in FIG. 1A in the following step. The channel structures CH2 shown in FIG. 1A are currently embedded in portions of the remained stacking structure 300 between the openings P2, and will be released in subsequent steps. In some embodiments, the portions of the remained stacking structure 300 embedded with the channel structures CH2 are narrow enough that other portions of the remained stacking structure 300 may only be slightly consumed during the subsequent channel release step. For instance, these portions of the remained stacking structure 300 may have a width substantially identical with the width W as described with reference to FIG. 3B. A method for forming the openings P2 may include a lithography process and an etching process (e.g., an anisotropic etching process).

Figure 3H:
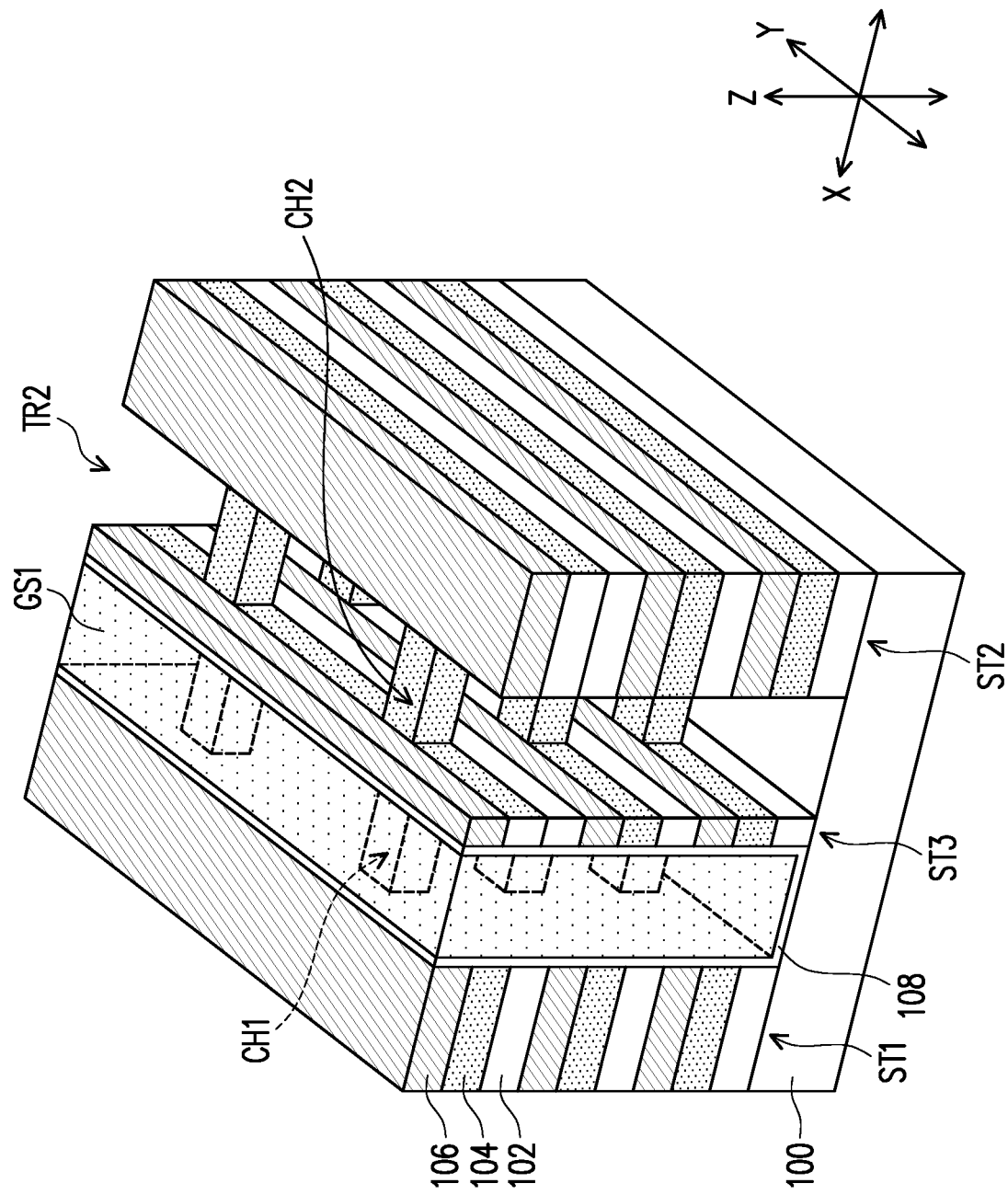

Referring to FIG. 2 and FIG. 3H, step S114 is performed, and the channel structures CH2 are released. As similar to the step described with reference to FIG. 3C, the conductive layers 306 and the isolation layers 302 in the portions of the remained stacking structure 300 between the openings P2 are currently removed. As a result, the openings P2 are currently communicated with one another to form a trench TR2, and the channel layers 304 in these portions of the stacking structure 300 are released to form the channel structures CH2. The channel structures CH2 extend across the trench TR2, and bridge portions of the channel layers 304 at opposite sides of the trench TR1. Moreover, after forming the trench TR2, the stacking structures ST1, ST2, ST3 separated by the trenches TR1, TR2 are defined, and the remained isolation layers 302, channel layers 304 and conductive layers 306 become the isolation layers 102, the channel layers 104 and the conductive layers 106 as shown in FIG. 1A. In some embodiments, a method for releasing the channel structures CH2 includes at least one isotropic etching process. Since the channel layers 304 have sufficient etching selectivity with respect to the conductive layers 306 and the isolation layers 302, the channel layers 304 may substantially remain intact during the isotropic etching process. Further, as described with reference to FIG. 3F, the width of the portions of the stacking structure 300 between the openings P2 may be short enough that the conductive layers 306 and the isolation layers 302 in other portions of the stacking structure 300 may only be slightly consumed (as similar to the structure shown in FIG. 4) during the isotropic etching process, and the lateral recesses of the conductive layers 306 and the isolation layers 302 may be identical or different.

Figure 3I:
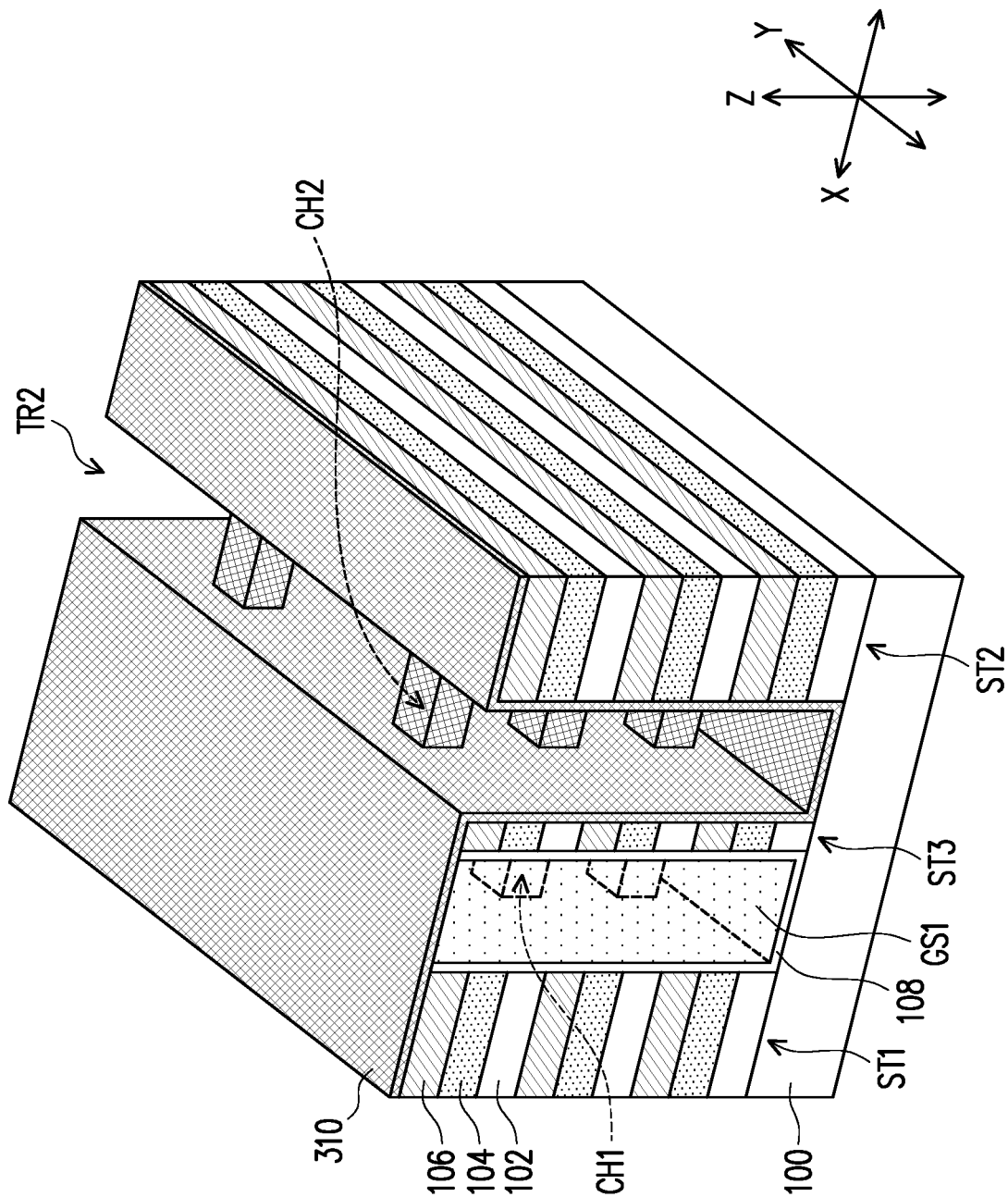

Referring to FIG. 2 and FIG. 3I, step S116 is performed, and a switching layer 310 is formed on the current structure. The switching layer 310 will be patterned to form the switching layer 110 as shown in FIG. 1A. In some embodiments, the switching layer 310 globally and conformally covers the structure shown in FIG. 3H. Accordingly, exposed surfaces of the channel structures CH2, the stacking structures ST1, ST2, ST3 and the substrate 100 may be conformally covered by the switching layer 310. In some embodiments, a method for forming the switching layer 310 may include a deposition process, such as an ALD process or a CVD process.

Figure 3J:
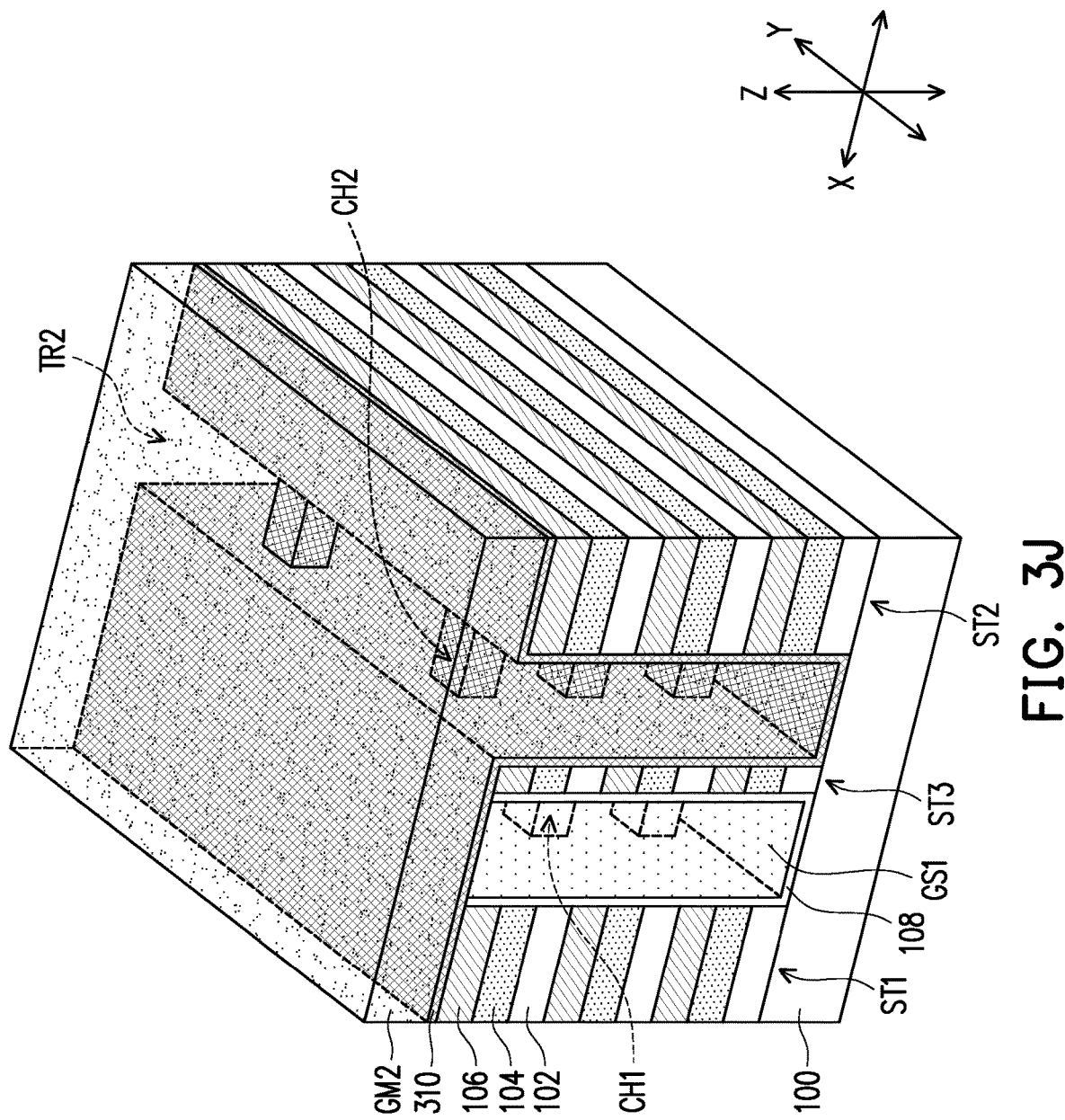

Referring to FIG. 2 and FIG. 3J, step S118 is performed, and a gate material GM2 is formed on the current structure. The gate material GM2 will be patterned to form the gate structure GS2 as shown in FIG. 1A. The gate material GM2 may fill up the trench TR2, and may extend onto the topmost surface of the switching layer 310. In this way, the channel structures CH2 in the trench TR2 are wrapped by the switching layer 310 and the gate material GM2, and portions of the switching layer 310 above the stacking structures ST1, ST2, ST3 may also be covered by the gate material GM2. In some embodiments, a method for forming the gate material GM2 includes a deposition process (e.g., a CVD process or a PVD process), a plating process or a combination thereof.

Figure 3K:
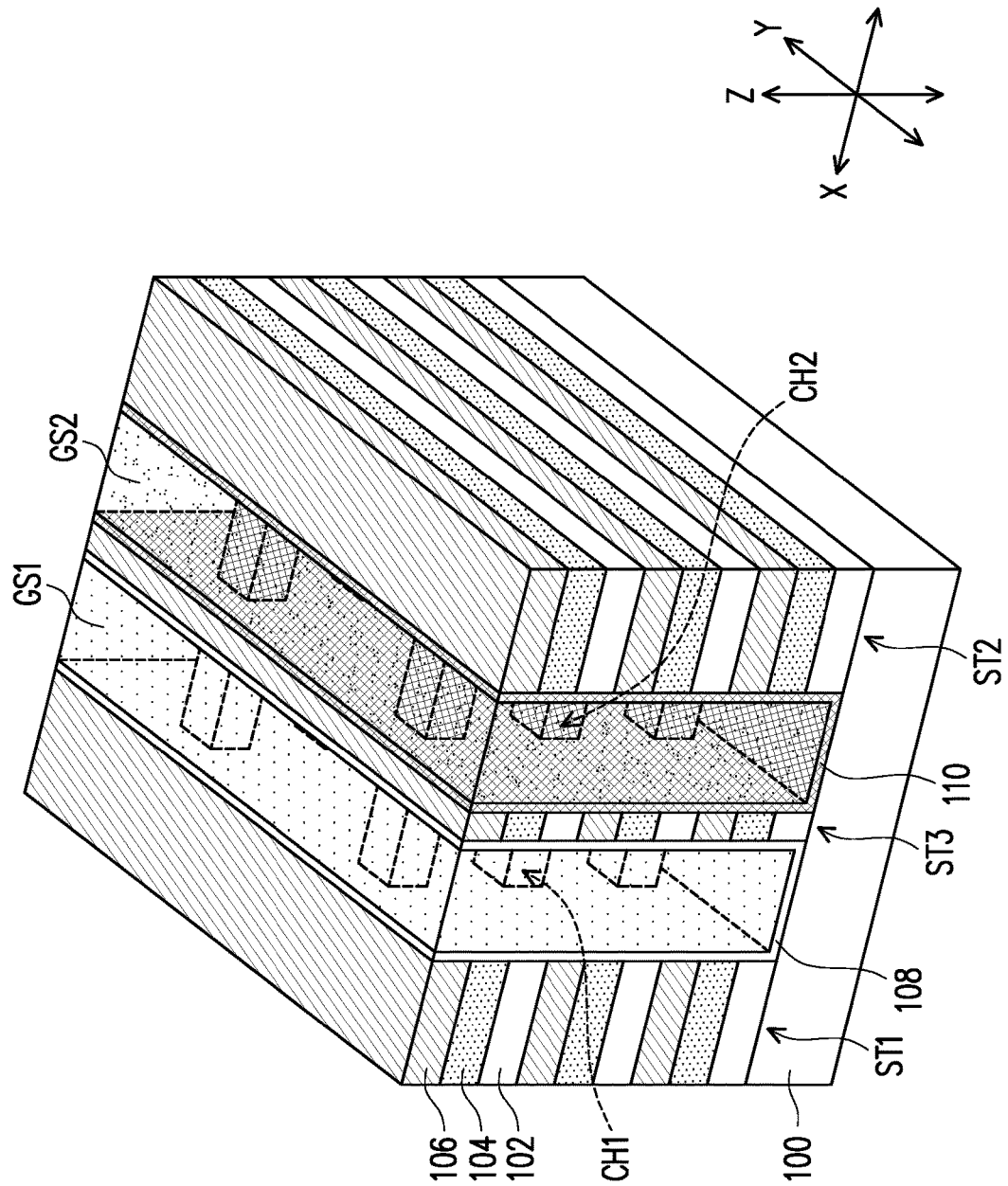

Referring to FIG. 2 and FIG. 3K, step S120 is performed, and portions of the gate material GM2 and the switching layer 310 above the stacking structures ST1, ST2, ST3 are removed. The remained gate material GM2 forms the gate structure GS2 as shown in FIG. 1A, and the remained switching layer 310 forms the switching layer 110 as shown in FIG. 1A. In addition, top surfaces of the stacking structures ST1, ST2, ST3 are currently exposed. In some embodiments, a method for removing the portions of the gate material GM2 and the switching layer 310 includes a planarization process. For instance, the planarization process may include a polishing process (e.g., a chemical mechanical polishing (CMP) process), an etching process or a combination thereof.

Referring to FIG. 2 and FIG. 1A, step S122 is performed, and the isolation wall 112 is formed. As described with reference to FIG. 1A, the isolation wall 112 vertically penetrates through the current structure on the substrate 100, and cuts each of the gate structure GS1, the gate dielectric layer 108, the stacking structure ST3, the gate structure GS2 and the switching layer 110 into separated portions. The separated portions of the gate structure GS1 respectively wrap a stack of the channel structures CH1, and the separated portions of the gate structure GS2 respectively wrap a stack of the channel structures CH2. In some embodiments, a method for forming the isolation wall 112 includes forming a trench in the structure shown in FIG. 3J by a lithography process and an etching process, and filling an insulating material into the trench by a deposition process (e.g., a CVD process). Subsequently, portions of the insulating material above the stacking structures ST1, ST2, ST3 may be removed by a planarization process, and the remained insulating material forms the isolation wall 112. For instance, the planarization process may include a polishing process (e.g., a CMP process), an etching process or a combination thereof.

Up to here, the memory device 10 as shown in FIG. 1A is formed. The memory device 10 may be subjected to further process for out-routing the gate structures GS1, GS2 as well as the conductive layers 106 in the stacking structures ST1, ST2. Moreover, in alternative embodiments, the staircase structure(s) for exposing the conductive layers 106 of the stacking structures ST1, ST2 may be formed after formation of the trenches TR1, TR2. In these alternative embodiments, the staircase structure(s) is/are formed by a staircase-last process.

Figure 5:
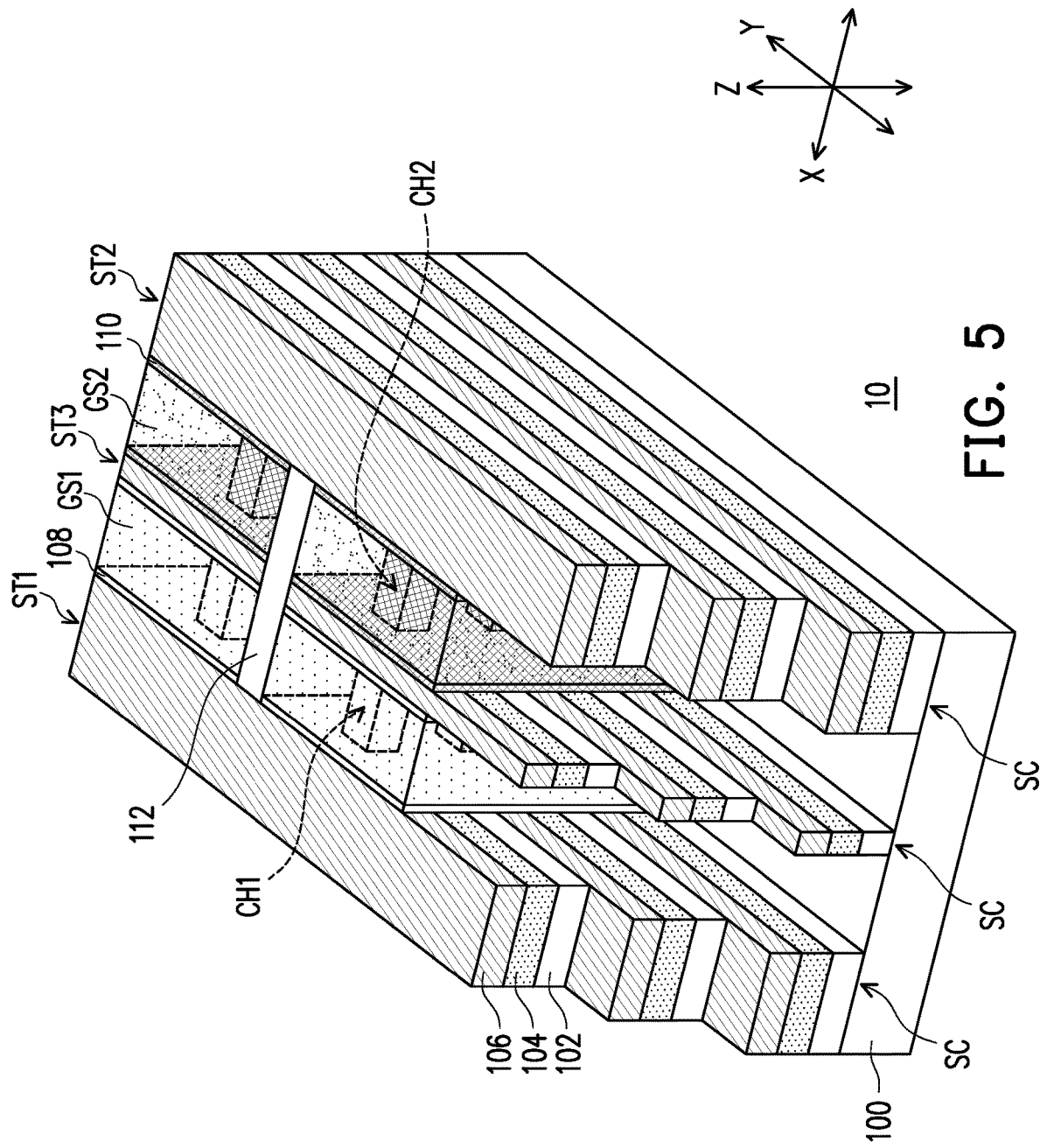
FIG. 5 is a schematic three-dimensional view illustrating a memory device with staircase structures according to some embodiments of the present disclosure.

FIG. 5 is a schematic three-dimensional view illustrating the memory device 10 with staircase structures SC according to some embodiments of the present disclosure.

Referring to FIG. 5, end portions of the stacking structures ST1, ST2 are shaped into staircase structures SC by the staircase-first process or the staircase-last process. In some embodiments, each of the conductive layers 106 (except for the topmost conductive layers 106) in the stacking structures ST1, ST2 as well as the underlying channel layer 104 and isolation layer 102 are laterally protruded from overlying isolation layer 102, channel layer 104 and conductive layer 106, thus each conductive layer 106 could be exposed at a step of one of the staircase structures SC. By forming the staircase structures SC, the conductive layers 106 can be independently out-routed, for example, to a driving circuit (as will be further described with reference to FIG. 6). In some embodiments, an end portion of the stacking structure ST3 is also shaped into a staircase structure SC. Nevertheless, the conductive layers 106 in the stacking structure ST3 may not be out routed. Moreover, in some embodiments, at least the gate structures GS1, GS2 filled between the stacking structures ST1, ST2, ST3 may not extend to the end portions of the stacking structures ST1, ST2, ST3 (i.e., the staircase structures SC). In these embodiments, isolation structures (not shown) may be filled between the staircase structures SC. In addition, in some embodiments, the staircase structures SC are covered by a dielectric layer (also not shown).

Figure 6:
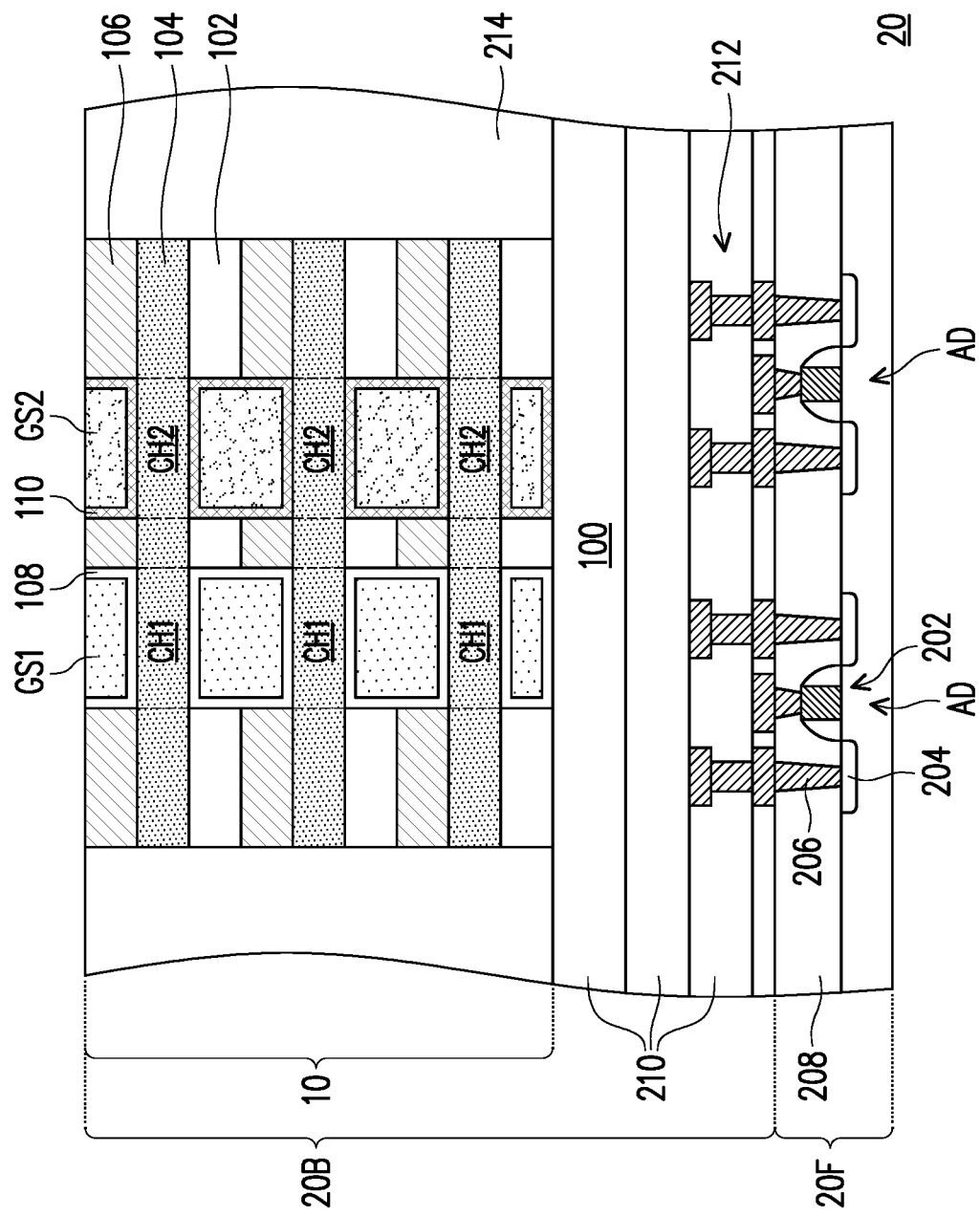
FIG. 6 is a schematic cross-sectional view illustrating a semiconductor device according to some embodiments in the present disclosure.

FIG. 6 is a schematic cross-sectional view illustrating a semiconductor device 20 according to some embodiments in the present disclosure.

Referring to FIG. 1A and FIG. 6, in some embodiments, the memory device 10 as described with reference to FIG. 1A is embedded in a back-end-of-line (BEOL) structure 20B of the semiconductor device 20 shown in FIG. 6. The BEOL structure 20B is formed on a front-end-of-line (FEOL) structure 20F, and includes conductive elements electrically connected to active devices in the FEOL structure 20F. In some embodiments, the FEOL structure 20F is formed on a surface region of a semiconductor substrate 200. For instance, the semiconductor substrate 200 may be a semiconductor wafer or a SOI wafer. The FEOL structure 20F may include active devices AD. For conciseness, only two of the active devices AD is depicted. The active devices AD, such as a transistor, may respectively include a gate structure 202 and source/drain structures 204 at opposite sides of the gate structure 202. In some embodiments, the gate structure 202 is disposed on a substantially flat surface of the semiconductor substrate 200, and the source/drain structures 204 at opposite sides of the gate structure 202 are formed in shallow regions of the semiconductor substrate 200. In these embodiments, the active device AD may be referred as a planar-type field effect transistor (FET), and a skin portion of the semiconductor substrate 200 covered by the gate structure 202 and extending between the source/drain structures 204 is functioned as a conductive channel of the FET. In alternative embodiments, the active device AD is formed as a fin-type FET (or referred as finFET) or a gate-all-around (GAA) FET. In these alternative embodiments, three-dimensional structures intersected with and covered by a gate structure are functioned as conductive channels of these FETs. Further, the FEOL structure 20F may include contact plugs 206 standing on the gate structures 202 and the source/drain structures 204, as well as a dielectric layer 208 laterally surrounding the gate structure 202 and the contact plugs 206.

The BEOL structure 20B may include a stack of dielectric layers 210, and include conductive elements 212 formed in the stack of dielectric layers 210. The conductive elements 212 may include conductive traces and conductive vias. The conductive traces respectively extend on one of the dielectric layers 210. The conductive vias respectively penetrate through one or more of the dielectric layers 210, and establish electrical contact with one or more of the conductive traces. The conductive elements 212 are electrically connected to the active devices AD in the FEOL structure 20F. In addition, the memory device 10 on the substrate 100 may be formed in another dielectric layer 214, and routed to the underlying conductive elements 212 through conductive vias (not shown) penetrating through the substrate 100. In some embodiments, some of the active devices AD and the conductive elements 212 interconnecting these active devices AD are electrically connected to the memory device 10, and collectively form a logic circuit for driving the memory device 10.

Figure 7:
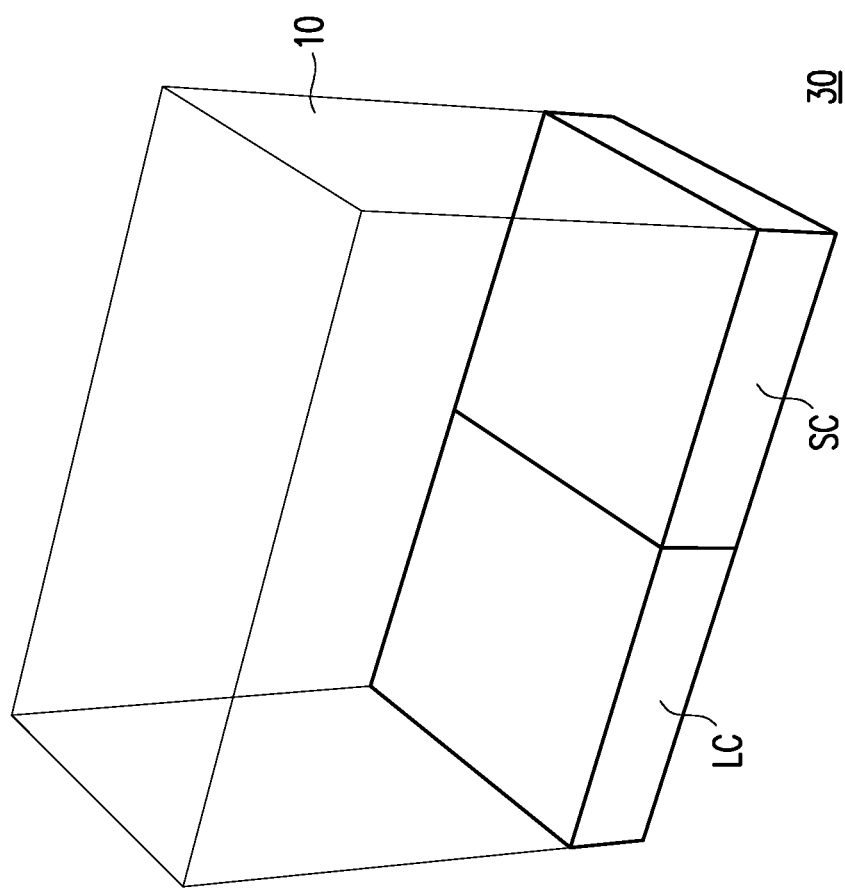
FIG. 7 is a schematic diagram illustrating a semiconductor die according to some embodiments of the present disclosure.

FIG. 7 is a schematic diagram illustrating a semiconductor die 30 according to some embodiments of the present disclosure.

Referring to FIG. 7, in some embodiments, a logic circuit LC and a static random access memory (SRAM) circuit SC are integrated in the semiconductor die 30. The logic circuit LC and the SRAM circuit SC may be formed in a FEOL structure and a portion of a BEOL structure of the semiconductor die 30, and may be laterally adjacent to each other. The FEOL structure and the BEOL structure described herein are structurally similar to the FEOL structure 20F and the BEOL structure 20B as described with reference to FIG. 6. Further, the memory device 10 shown in FIG. 1A is embedded in the BEOL structure of the semiconductor die 30, and is disposed over the logic circuit LC and the SRAM circuit SC. At least a portion of the logic circuit SC may be electrically connected to the overlying memory device 10, for driving the memory device 10. By stacking the memory device 10 over the logic circuit LC and the SRAM circuit SC, a footprint area of the semiconductor die 30 can be further reduced.

Figure 8:
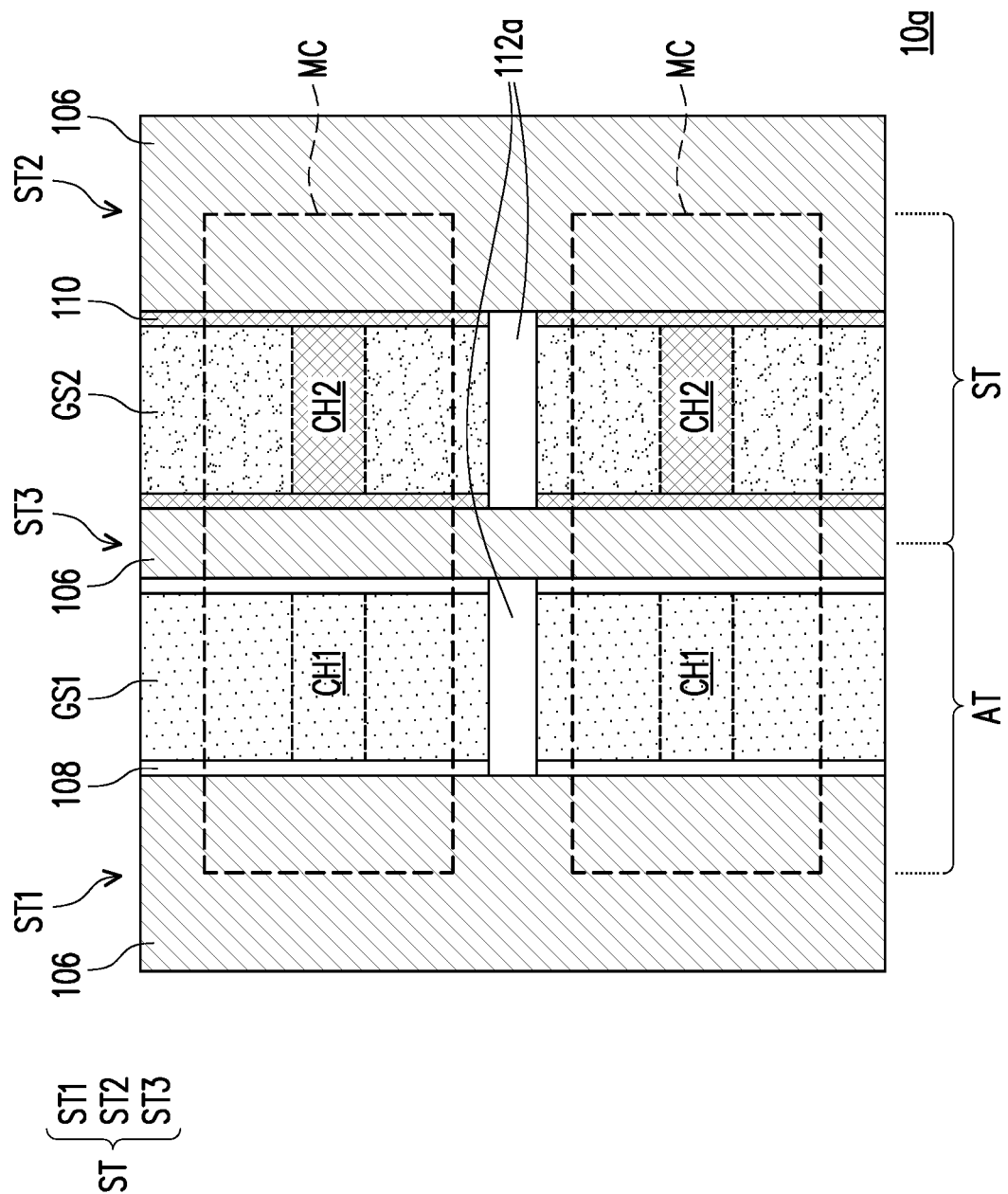
FIG. 8 is a schematic plan view illustrating laterally adjacent memory cells of a memory device according to some embodiments of the present disclosure.

FIG. 8 is a schematic plan view illustrating laterally adjacent memory cells MC of a memory device 10a according to some embodiments of the present disclosure. The memory device 10a is similar to the memory device 10 described with reference to FIG. 1A through FIG. 1D, only differences therebetween will be described, the like or the same parts will not be repeated again.

Referring to FIG. 8, in some embodiments, an isolation wall 112a for operationally separating laterally adjacent memory cells MC does not laterally penetrate though the stacking structure ST3. Instead, the isolation wall 112 may have separated portions standing at opposite sides of the stacking structure ST3. One of the portions of the isolation wall 112a extends through the gate structure GS1 and the gate dielectric layer 108 along the direction X. Similarly, another one of the portions of the isolation wall 112a extends through the gate structure GS2 and the switching layer 110 along the direction X. In these embodiments, the conductive layers 106 in the stacking structure ST3 respectively extend through laterally adjacent memory cells MC, and are respectively shared by the laterally adjacent memory cells MC.

Figure 9:
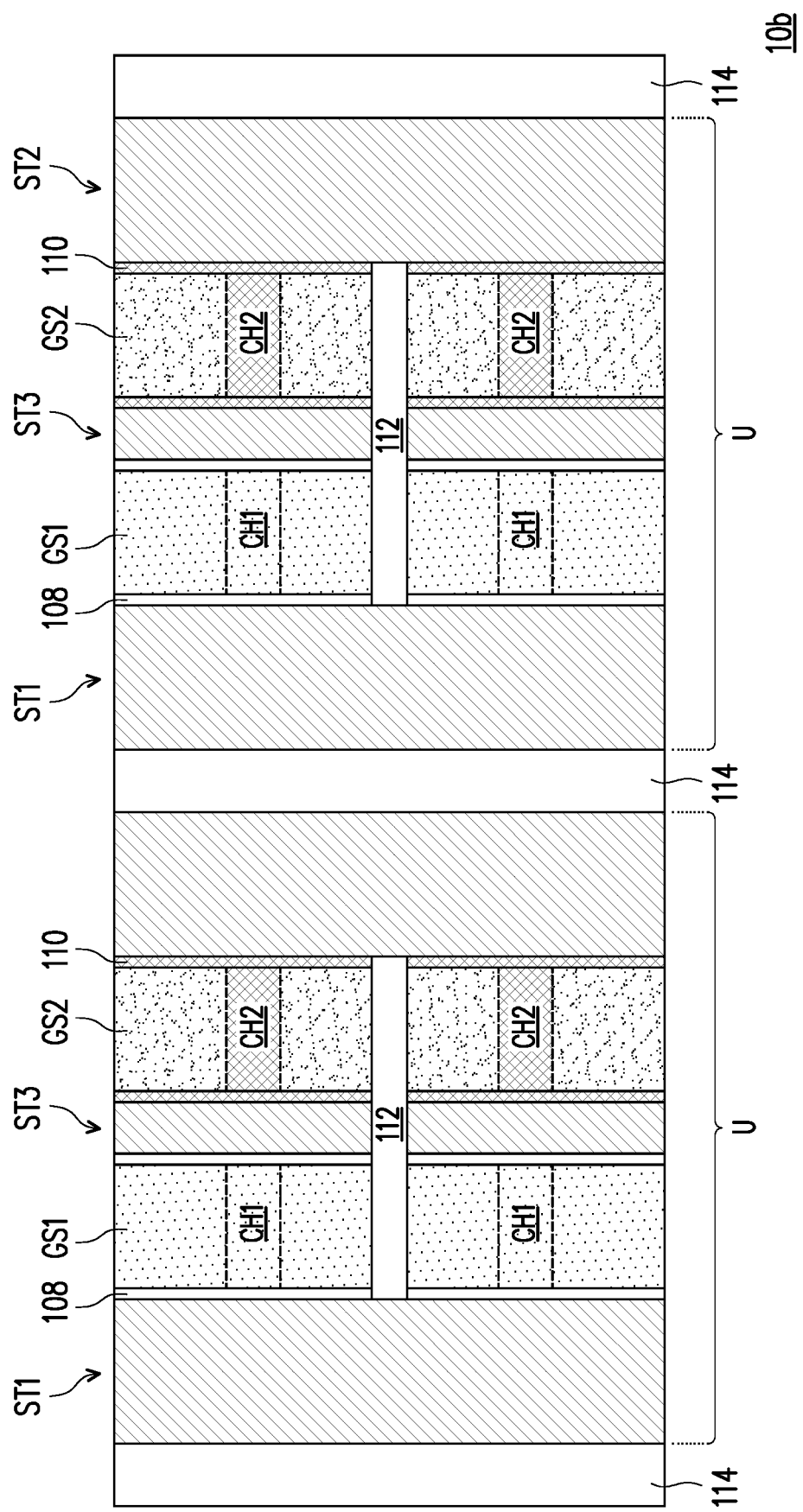
FIG. 9 is a schematic plan view illustrating a memory device according to some embodiments of the present disclosure.

FIG. 9 is a schematic plan view illustrating a memory device 10b according to some embodiments of the present disclosure. The memory device 10b is similar to the memory device 10 described with reference to FIG. 1A through FIG. 1D, only differences therebetween will be described, the like or the same parts will not be repeated again.

Referring to FIG. 9, the memory device 10b includes multiple repetitive units U arranged along the direction X. Each of the repetitive units U may be the structure shown in FIG. 1A. Although only two of the repetitive units U are depicted in FIG. 9, the memory device 10b may include more of the repetitive units U. In some embodiments, laterally adjacent repetitive units U are separated from each other by an insulating wall 114. The insulating wall 114 stands on the substrate 100 (shown in FIG. 1A), and may extend along the direction Y. The insulating wall 114 may be formed of an insulating material, such as silicon oxide, silicon nitride, silicon oxynitride or the like. In addition, a method for forming the insulating wall 114 may include forming a trench by a lithography process and an etching process (e.g., an anisotropic etching process), and include filling the insulating material into the trench by a deposition process (e.g., a CVD process). Subsequently, portions of the insulating material outside the trench are removed by a planarization process, and the remained portion of the insulating material forms the insulating wall 114. For instance, the planarization process may include a polishing process, an etching process or a combination thereof. In some embodiments, the insulating wall 114 and the isolation wall 112 may be formed in the same step. In alternative embodiments, the insulating wall 114 is formed before or after formation of the isolation wall 112.

Figure 10:
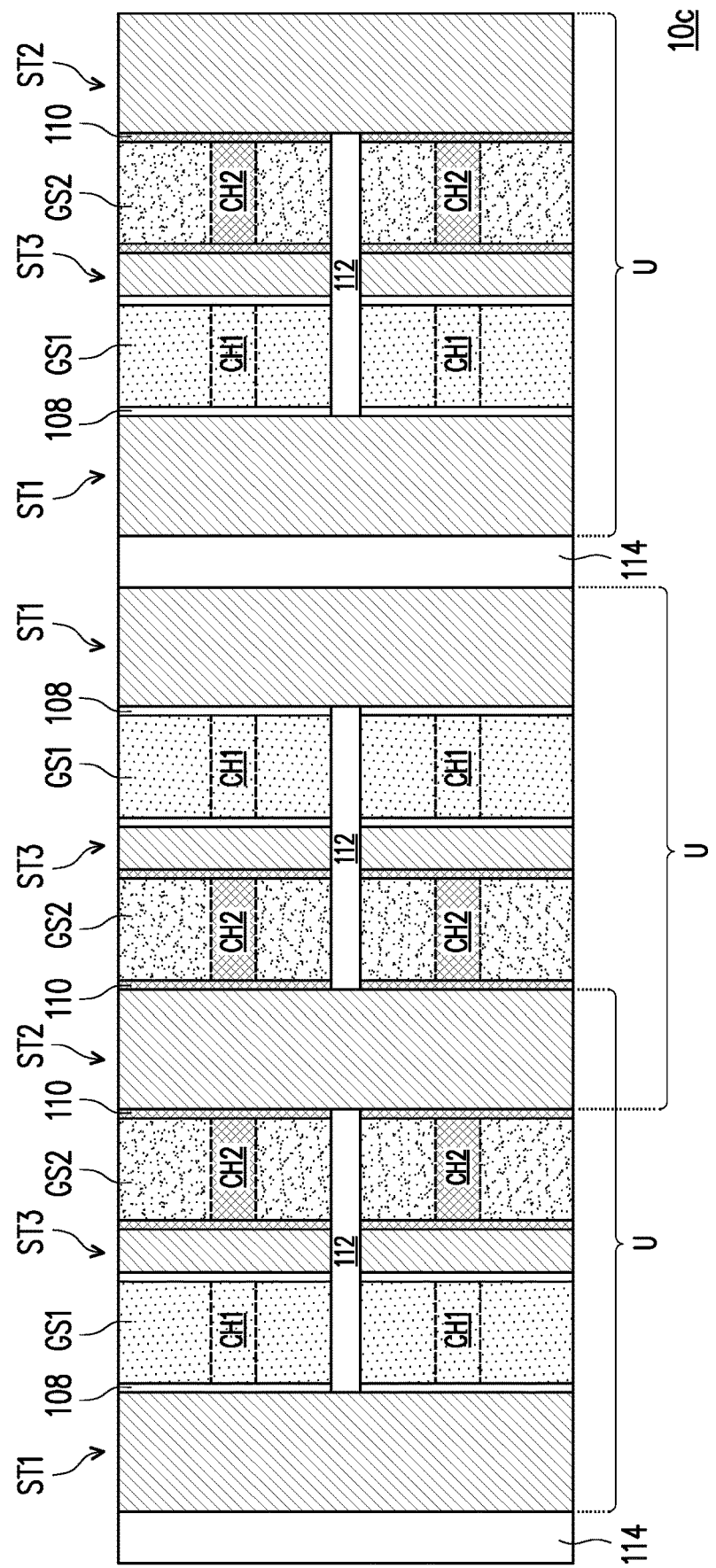
FIG. 10 is a schematic plan view illustrating a memory device according to some embodiments of the present disclosure.

FIG. 10 is a schematic plan view illustrating a memory device 10c according to some embodiments of the present disclosure. The memory device 10c is similar to the memory device 10b described with reference to FIG. 9, only differences therebetween will be described, the like or the same parts will not be repeated again.

Referring to FIG. 10, in some embodiments, the insulating walls 114 are alternately disposed between the repetitive units U. Those adjacent repetitive units U without one of the insulating walls 114 in between may share the same stacking structure ST1 or the same stacking structure ST2, and may be in mirror symmetry with respect to the common stacking structure ST1/ST2. On the other hand, those adjacent repetitive units U with one of the insulating walls 114 in between may not share any of the stacking structures ST1, ST2, ST3, and may or may not be in mirror symmetry with respect to the insulating wall 114.

As above, the memory device according to embodiments of the present disclosure includes stacks of memory cells. Since the memory cells are stackable, the memory device is no longer limited by two-dimensional design, and a storage density of the memory device may be significantly increased. Further, in those embodiments where the gate structures of the memory cells are formed of metallic material(s), the memory device can be more compatible with back-end-of-line (BEOL) process due to lower process temperature. Moreover, as compared to programming a storage transistor by using hot carrier injection effect, a much lower voltage is required for programming the storage transistors in the memory cells according to some embodiments of the present disclosure by ferroelectric polarization effect.

In an aspect of the present disclosure, a memory device is provided. The memory device comprises: first, second and third stacking structures, laterally spaced apart from one another, and respectively comprising a conductive layer, an isolation layer and a channel layer sandwiched between the conductive layer and the isolation layer, wherein the third stacking structures is located between the first and second stacking structures; a first channel structure, located between the first and third stacking structures, and connecting to the channel layers in the first and third stacking structures; a second channel structure, located between the second and the third stacking structures, and connecting to the channel layers in the second and third stacking structures; a gate dielectric layer, covering opposing sidewalls of the first and third stacking structures and wrapping around the first channel structure; a switching layer, covering opposing sidewalls of the second and third stacking structures and wrapping around the second channel structure; a first gate structure, filled in a space between the first and third stacking structures and covering the gate dielectric layer; and a second gate structure, filled in a space between the second and third stacking structures and covering the switching layer.

In another aspect of the present disclosure, a semiconductor device is provided. The semiconductor device comprises a front-end-of-line (FEOL) structure and a back-end-of-line (BEOL) structure. The FEOL structure has active devices therein. The BEOL structure is disposed on the FEOL structure, and comprises conductive elements, an etching stop layer and a memory device. The conductive elements are electrically connected to the active devices in the FEOL structure. The etching stop layer lies over the conductive elements. The memory device is formed on the etching stop layer, and comprises: first, second and third stacking structures, laterally spaced apart from one another, and respectively comprising a conductive layer, an isolation layer and a channel layer sandwiched between the conductive layer and the isolation layer, wherein the third stacking structure is located between the first and second stacking structures; a first channel, extending between the channel layers in the first and third stacking structures; a second channel, extending between the channel layers in the second and third stacking structures; a gate dielectric layer, covering opposing sidewalls of the first and third stacking structures and wrapping around the first channel; a switching layer, covering opposing sidewalls of the second and third stacking structures and wrapping around the second channel; a first gate structure, filled in a space between the first and third stacking structures and covering the gate dielectric layer; and a second gate structure, filled in a space between the second and third stacking structures and covering the switching layer.

In yet another aspect of the present disclosure, a manufacturing method of a memory device is provided. The method comprises: forming an initial stacking structure on a substrate, where the initial stacking structure comprises a conductive layer, an isolation layer and a channel layer sandwiched between the conductive layer and the isolation layer; forming first openings penetrating through the initial stacking structure, wherein the first openings are laterally spaced apart from one another, and are arranged along a first direction; removing portions of the conductive layer and portions of the isolation layer between the first openings, such that the first openings are communicated with one another to form a first trench, and portions of the channel layer remained in the first trench forms first channel structures extending along a second direction intersected with the first direction; forming a gate dielectric layer and a first gate structure in the first trench, wherein the gate dielectric layer conformally covers the first channel structures and sidewalls of the first trench, and the first gate structure covers the gate dielectric layer and fills up the first trench; forming second openings aside the filled first trench, wherein the second openings are laterally spaced apart from one another, and are arranged along the first direction; removing portions of the conductive layer and portions of the isolation layer between the second openings, such that the second openings are communicated with one another to form a second trench, and portions of the channel layer remained in the second trench forms second channel structures extending along the second direction; and forming a switching layer and a second gate structure in the second trench, wherein the switching layer conformally covers the second channel structures and sidewalls of the second trench, and the second gate structure covers the switching layer and fills up the second trench.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   first, second and third stacking structures, laterally spaced apart from one another, and respectively comprising a conductive layer, an isolation layer and a channel layer sandwiched between the conductive layer and the isolation layer, wherein the third stacking structures is located between the first and second stacking structures;
   a first channel structure, located between the first and third stacking structures, and connecting to the channel layers in the first and third stacking structures;
   a second channel structure, located between the second and the third stacking structures, and connecting to the channel layers in the second and third stacking structures;
   a gate dielectric layer, covering opposing sidewalls of the first and third stacking structures and wrapping around the first channel structure;
   a switching layer, covering opposing sidewalls of the second and third stacking structures and wrapping around the second channel structure;
   a first gate structure, filled in a space between the first and third stacking structures and covering the gate dielectric layer; and
   a second gate structure, filled in a space between the second and third stacking structures and covering the switching layer.

2. The memory device according to claim 1, wherein the switching layer is formed of a ferroelectric material.

3. The memory device according to claim 1, wherein the conductive layer, the isolation layer and a channel layer constitute a film set, the first, second and third stacking structures respectively comprises a plurality of the film sets stacked along a vertical direction, the memory device comprises a plurality of the first channel structures and a plurality of the second channel structures, the first channel structures respectively extend between the channel layers in the film sets of the first and third stacking structures, and the second channel structures respectively extend between the channel layers in the film sets of the second and third stacking structures.

4. The memory device according to claim 3, wherein the first channel structures are vertically spaced apart from one another and respectively wrapped by the gate dielectric layer and the first gate structure, and the second channel structures are vertically spaced apart from one another and respectively wrapped by the switching layer and the second gate structure.

5. The memory device according to claim 4, wherein the memory device further comprises
an additional first channel structure, extending between the channel layers in the first and third stacking structures and laterally spaced apart from the first channel structure, wherein the additional first channel structure is wrapped by the gate dielectric layer and the first gate structure along with the first channel structure; and
an additional second channel structure, extending between the channel layers in the second and third stacking structures and laterally spaced apart from the second channel structure, wherein the additional second channel structure is wrapped by the switching layer and the second gate structure along with the second channel structure.

6. The memory device according to claim 5, further comprising:
an isolation wall, extending between the first channel structure and the additional first channel structure, and between the second channel structure and the additional second channel structure, to separate each of the first and second gate structures into separated portions, wherein the first channel structure and the additional first channel structure are respectively wrapped by one of the separated portions of the first gate structure, and the second channel structure and the additional second channel structure are respectively wrapped by one of the separated portions of the second gate structure.

7. The memory device according to claim 6, wherein the isolation wall further extends to separate each of the gate dielectric layer and the switching layer into separated portions.

8. The memory device according to claim 7, wherein the isolation wall laterally penetrates through the third stacking structure.

9. The memory device according to claim 1, wherein the first and second gate structures are respectively formed of a metallic material.

10. The memory device according to claim 1, wherein the first and second channel structures are respectively formed in a rod shape.

11. The memory device according to claim 1, further comprising:
a first insulating wall, covering a sidewall of the first stacking structure facing away from the third stacking structure; and
a second insulating wall, covering a sidewall of the second stacking structure facing away from the third gate structure.

12. The memory device according to claim 1, further comprising:
an additional stacking structure, laterally spaced apart from the second stacking structure and located at a side of the second stacking structure facing away from the third stacking structure;
an additional channel structure, located between the second stacking structure and the additional stacking structure, and connecting to the channel layer in the second stacking structure and a channel layer in the additional stacking structure.

13. The memory device according to claim 12, further comprising:
an additional switching layer and an additional gate structure, wrapping around the additional channel structure, wherein the additional switching layer is disposed between the additional channel structure and the additional gate structure.

14. The memory device according to claim 12, further comprising:
a insulating wall, covering a sidewall of the first stacking structure facing away from the third stacking structure.

15. A semiconductor device, comprising:
a front-end-of-line (FEOL) structure, having active devices therein; and
a back-end-of-line (BEOL) structure, disposed on the FEOL structure, and comprising:
conductive elements, electrically connected to the active devices in the FEOL structure;
an etching stop layer, lying over the conductive elements; and
a memory device, formed on the etching stop layer, and comprising:
first, second and third stacking structures, laterally spaced apart from one another, and respectively comprising a conductive layer, an isolation layer and a channel layer sandwiched between the conductive layer and the isolation layer, wherein the third stacking structure is located between the first and second stacking structures;
a first channel, extending between the channel layers in the first and third stacking structures;
a second channel, extending between the channel layers in the second and third stacking structures;
a gate dielectric layer, covering opposing sidewalls of the first and third stacking structures and wrapping around the first channel;
a switching layer, covering opposing sidewalls of the second and third stacking structures and wrapping around the second channel;
a first gate structure, filled in a space between the first and third stacking structures and covering the gate dielectric layer; and
a second gate structure, filled in a space between the second and third stacking structures and covering the switching layer.

16. The semiconductor device according to claim 15, wherein the active devices and at least a portion of the conductive elements form a logic circuit and a static random access memory (SRAM) circuit.

17. The semiconductor device according to claim 15, wherein the substrate has etching selectivity with respect to the isolation layer, the channel layer and the conductive layer of the memory device.

* * * * *